(12) United States Patent
Tomita et al.

(10) Patent No.: US 6,661,728 B2
(45) Date of Patent: Dec. 9, 2003

(54) SUPPLY VOLTAGE GENERATING CIRCUIT AND SEMICONDUCTOR MEMORY DEVICE USING SAME

(75) Inventors: Hiroyoshi Tomita, Kawasaki (JP); Shinnosuke Kamata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/061,304

(22) Filed: Feb. 4, 2002

(65) Prior Publication Data

US 2002/0105848 A1 Aug. 8, 2002

(30) Foreign Application Priority Data

Feb. 7, 2001 (JP) ........................................ 2001-030329

(51) Int. Cl.[7] ................................................. G11C 7/00
(52) U.S. Cl. ................... 365/226; 365/189.09; 365/233
(58) Field of Search ........................ 365/226, 189.09, 365/233, 189.07, 194

(56) References Cited

U.S. PATENT DOCUMENTS

| | | | |
|---|---|---|---|
| 5,283,762 A | * | 2/1994 | Fujishima .............. 365/189.09 |
| 5,495,452 A | * | 2/1996 | Cha ........................... 365/222 |
| 5,870,333 A | * | 2/1999 | Matsumoto .............. 365/185.2 |
| 5,969,981 A | * | 10/1999 | Kono ........................ 365/145 |
| 6,449,197 B1 | * | 9/2002 | Hiraki et al. .......... 365/189.05 |

OTHER PUBLICATIONS

Patent Abstracts of Japan, 58171842 A, Aug. 10,. 1983.

* cited by examiner

Primary Examiner—David Nelms
Assistant Examiner—Gene N. Auduong
(74) Attorney, Agent, or Firm—Arent Fox Kintner Plotkin & Kahn, PLLC

(57) ABSTRACT

A semiconductor memory device with a supply voltage generating circuit which can fine-tune its output voltages according to the frequency of a given clock signal. A reference voltage generator produces a plurality of different reference voltages. A clock signal receiver accepts a clock signal and supplies it to a period measurement unit for measurement of the cycle period of the given clock signal. A selector selects one of the produced reference voltages according to the clock period measured by the period measurement unit. A supply voltage generator produces a supply voltage corresponding to the selected reference voltage.

11 Claims, 23 Drawing Sheets

SUPPLY VOLTAGE GENERATING CIRCUIT AND SEMICONDUCTOR MEMORY DEVICE USING SAME

BACKGROUND OF THE INVENTION

1. Field of the Invention

The present invention relates to a supply voltage generating circuit and a semiconductor memory device using the same. More particularly, the present invention relates to a power supply generating circuit which produces a supply voltage according to the period of a given clock signal, as well as to a semiconductor memory device having such a supply voltage generating circuit.

2. Description of the Related Art

The switching speed of digital devices largely depends on their load capacitance, which includes input capacitance of connected components and stray capacitance between circuit wires, and wires and ground. A digital device has to charge or discharge such load capacitance through its own output resistance, so that the voltage at a receiving end will rise above or fall below a predetermined threshold level. This charging or discharging action results in a certain amount of delay time, which is actually determined by the time constant of each particular circuit, i.e., the product of circuit resistance and load capacitance.

It is known that both resistive and capacitive components of such a digital circuit are almost constant, regardless of supply voltages applied. This implies that the load capacitance would charge up to, or discharge down to a certain voltage level (or threshold) in a shorter time if the source voltage was higher. That is, a higher supply voltage is required for higher switching operations. Stated in reverse, the devices can operate with a lower supply voltage when they are not required to operate so fast, and this fact suggests the possibility of dynamic power saving. Since a digital circuit consumes electric power in proportion to its supply voltage, the power consumption can be reduced by lowering the supply voltage when the clock signal is slow.

In an attempt to implement the above concept, researchers have proposed several methods to control supply voltages in connection with the clock signal frequency. Conventional methods use a threshold voltage of digital circuitry as the voltage step size for varying a supply voltage level.

Also, there has been a trend toward digital circuits that operate at a lower voltage. Devices operating at less than three volts, for example, are commonly used today. For those low-voltage devices, however, the use of such threshold voltages as 0.6 to 0.7V is not appropriate since it is too coarse to tune the supply voltage at a required resolution.

SUMMARY OF THE INVENTION

In view of the foregoing, it is an object of the present invention to provide a supply voltage generating circuit which can fine-tune its output voltages according to the frequency of a given clock signal.

Further, it is another object to provide a semiconductor memory device having such a supply voltage generating circuit.

To accomplish the first object, according to the present invention, there is provided a supply voltage generating circuit which comprises the following elements: a reference voltage generator which produces a plurality of reference voltages; a period measurement unit which measures the period of a given clock signal; a selector which selects one of the produced reference voltages according to the measured clock period; and a supply voltage generator which produces a supply voltage corresponding to the selected reference voltage.

To accomplish the second object, according to the present invention, there is provided a semiconductor memory device which comprises the following elements: a memory unit with an input/output interface which stores given data; a reference voltage generator which produces a plurality of reference voltages; a period measurement unit which measures the period of a given clock signal; a selector which selects one of the produced reference voltages according to the measured clock period; a supply voltage generator which produces a supply voltage corresponding to the selected reference voltage for use in the memory unit; and a voltage regulator which provides the input/output interface of the memory unit with a constant supply voltage that does not vary with the period of the clock signal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Preferred embodiments of the present invention will be described below with reference to the accompanying drawings.

Figure 1:
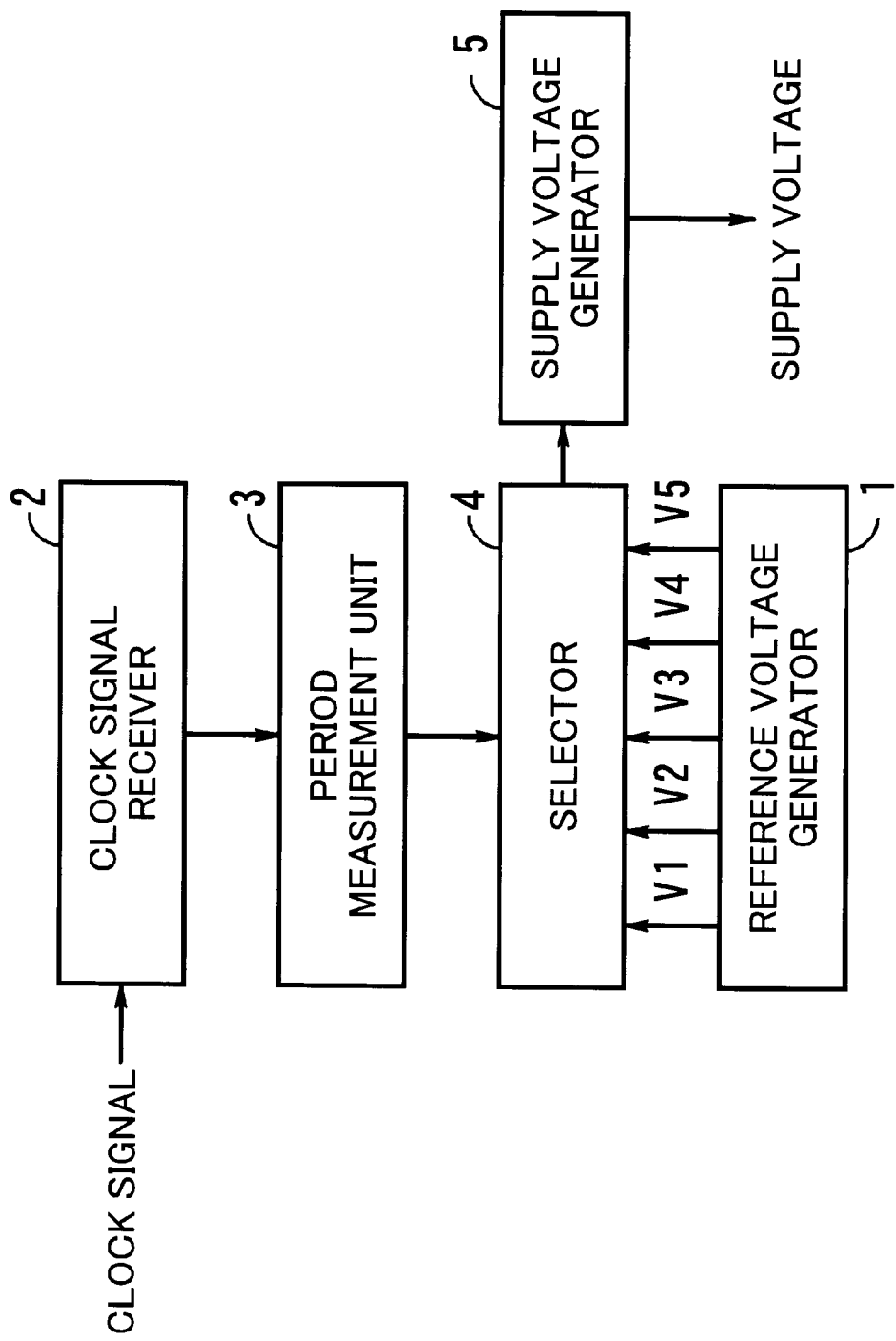
FIG. 1 is a conceptual view of the present invention.

FIG. 1 is a conceptual view of a supply voltage generating circuit according to the present invention. As this diagram shows, the circuit comprises the following functional blocks: a reference voltage generator 1, a clock signal receiver 2, a period measurement unit 3, a selector 4, and a supply voltage generator 5.

The reference voltage generator 1 produces a plurality of different reference voltages V1 to V5. The clock signal receiver 2 accepts a clock signal to be measured. The period measurement unit 3 measures the period of the clock signal supplied from the clock signal receiver 2. The selector 4 selects one of the reference voltages produced by the reference voltage generator 1, according to the measurement result provided by the period measurement unit 3. The supply voltage generator 5 produces a supply voltage corresponding to the selected reference voltage.

The supply voltage generating circuit of FIG. 1 operates as follows. The clock signal receiver 2 supplies the period measurement unit 3 with a given clock signal with a period of T1. The period measurement unit 3 measures the period of the clock signal supplied from the clock signal receiver 2, thus obtaining the value of T1. On the other hand, the reference voltage generator 1 produces a plurality of reference voltages by dividing a predetermined voltage with a plurality of resistors. In the example of FIG. 1, five reference voltages V1 to V5 are available to the selector 4. The voltages V1 to V5 are successively higher (i.e., V1<V2<V3<V4<V5) with a step size of, for example, 0.2 volts.

Out of the five reference voltages V1 to V5, the selector 4 selects an appropriate voltage that corresponds to the clock period measured by the period measurement unit 3. More specifically, it selects a higher reference voltage for a shorter clock period, and a lower reference voltage for a longer clock period. The selected reference voltage is then passed to the supply voltage generator 5, which produces a supply voltage associated with that reference voltage. Here, the supply voltage generator 5 may be configured to output a voltage equal to the selected reference voltage V1, V2, . . . or V5. Or alternatively, the supply voltage generator 5 may vary its output voltage in proportion to the selected reference voltage.

The above processing yields a higher supply voltage when the given clock signal has a shorter period, and a lower supply voltage when it has a longer period. While the reference voltages are produced at 0.2V intervals in the above example, the present invention is not limited to that specific step size. The circuit designers can create their reference voltage generator 1 with any desired voltage range and step size (e.g., 3V to 4V with 0.1V step) suitable for specific applications, by supplying an appropriate voltage to an appropriate set of resistors constituting a voltage divider.

In the above-described way, the proposed supply voltage generating circuit produces a plurality of reference voltages, selects one of them according to the clock period, and produces an appropriate supply voltage based on the selected reference voltage. It employs voltage dividing resistors to produce such reference voltages, permitting the supply voltages to be varied at any step size.

Referring next to FIGS. 2 to 16, a more specific embodiment of the present invention will be described. The explanation starts with a block diagram of FIG. 2, which shows a semiconductor memory device according to a first embodiment of the present invention. This memory device comprises a frequency detector 20, a reference voltage selector 30, a supply voltage generator 40, and a dynamic random access memory (DRAM) 50.

The frequency detector 20 detects the frequency (or period) of a given clock signal and passes the result to the reference voltage selector 30. The reference voltage selector 30 selects an appropriate reference voltage according to the detected clock frequency. The supply voltage generator 40 produces a supply voltage associated with the selected reference voltage. The DRAM 50 operates with the supply voltages provided by the supply voltage generator 40.

Figure 3:
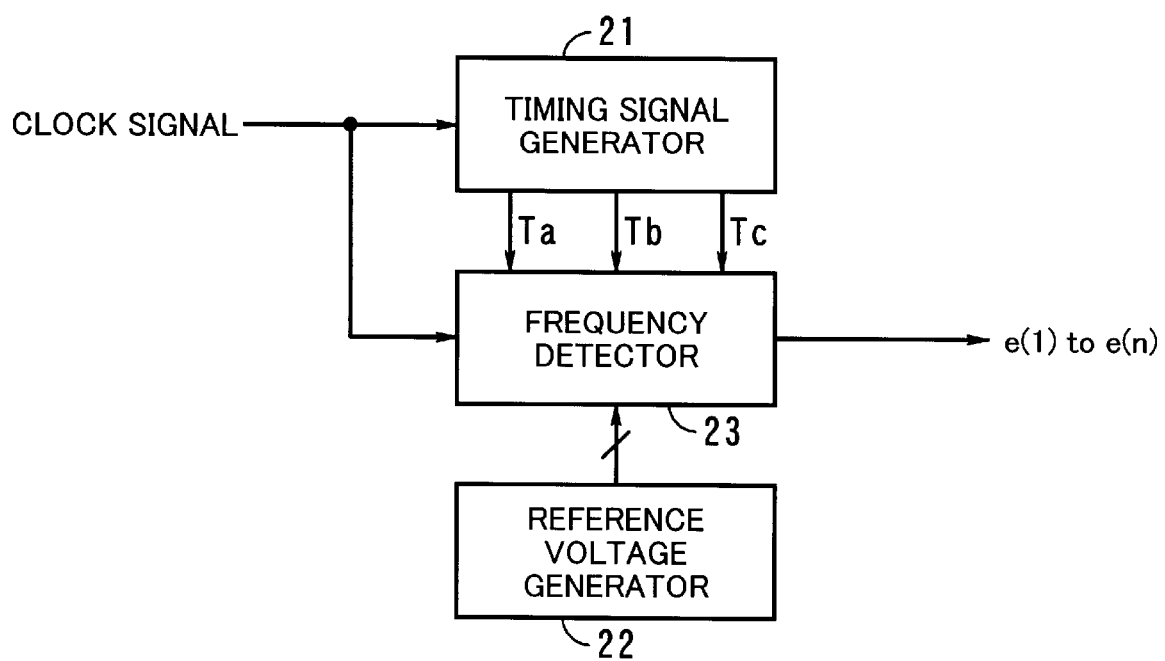
FIG. 3 is a block diagram of a frequency detector in FIG. 2.

FIG. 3 is a block diagram of the frequency detector 20. As seen from this figure, the frequency detector 20 comprises a timing signal generator 21, a reference voltage generator 22, and a frequency detector 23. The timing signal generator 21 produces three timing signals Ta, Tb, and Tc for use in the frequency detector 23 to make its components operate in orderly sequence. The reference voltage generator 22 produces a plurality of reference voltages by dividing a predetermined voltage with a plurality of resistors. Using these reference voltages, the frequency detector 23 detects the frequency of a given clock signal and produces control signals e(1) to e(n) according to the detected clock frequency.

Figure 4:
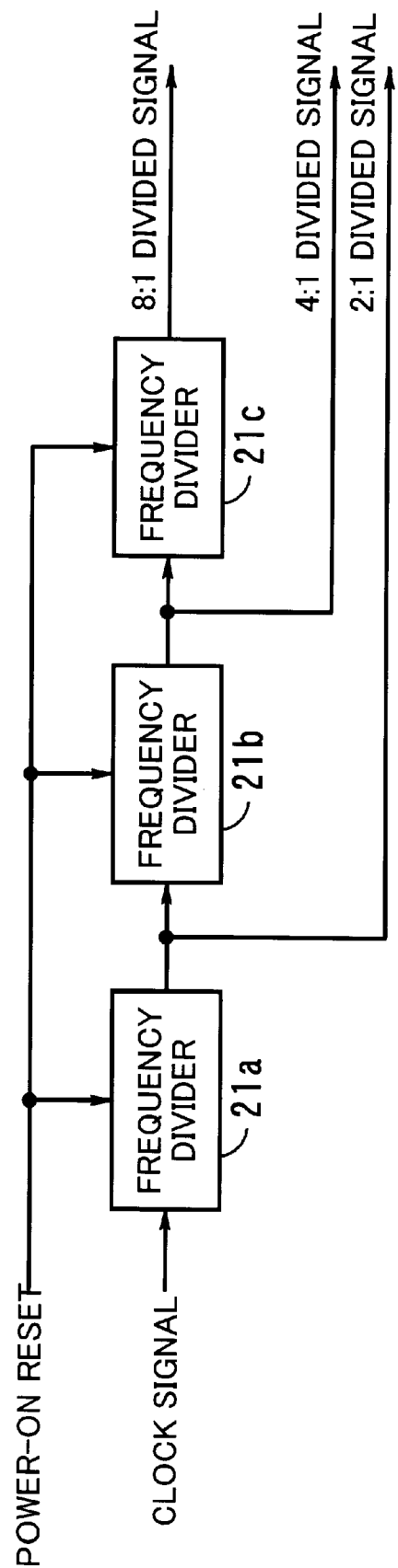
FIG. 4 is a partial block diagram of a timing signal generator in FIG. 3.

FIG. 4 is a partial block diagram of the timing signal generator 21 shown in FIG. 3. As seen from this diagram, the timing signal generator 21 has three stages of cascaded frequency dividers 21a to 21c. After being initialized by a power-on reset signal, the first-stage frequency divider 21a divides a given clock signal by two. The resultant 2:1 divided signal is passed to the second-stage frequency divider 21b for another divide-by-two operation, which yields a 4:1 divided signal. The third-stage frequency divider 21c further divides the 4:1 divided signal by two, thereby producing an 8:1 divided signal.

Figure 5:
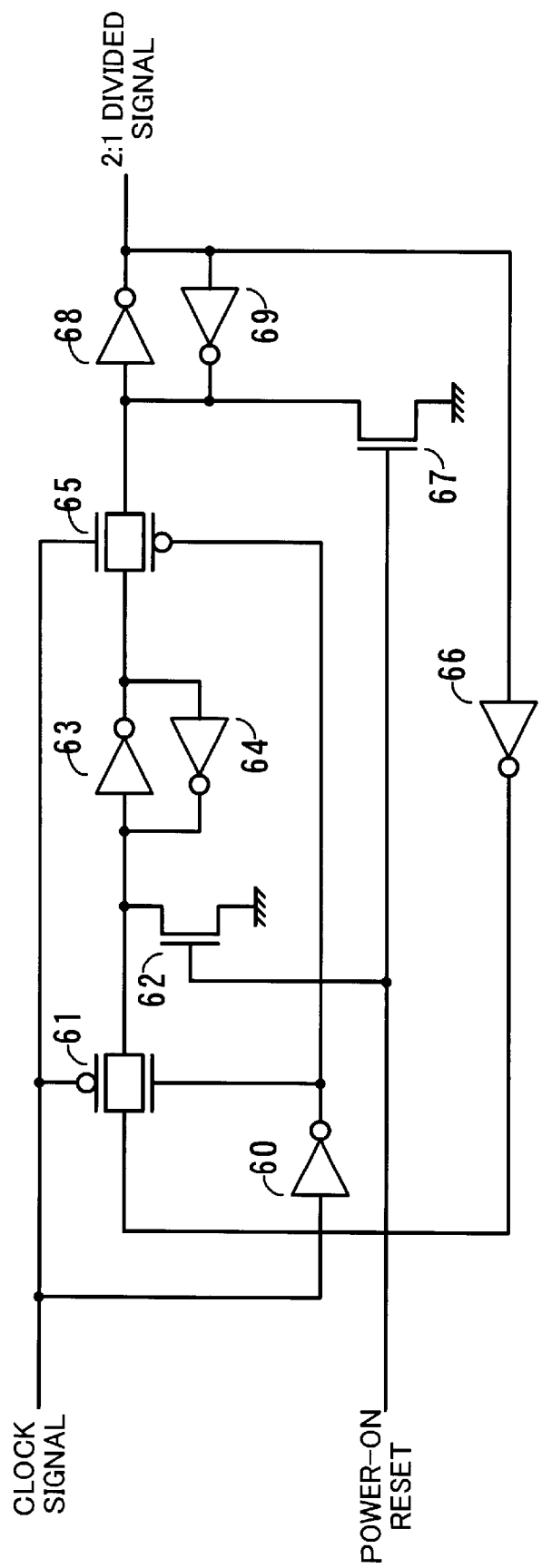
FIG. 5 is a schematic circuit diagram of a first-stage frequency divider in FIG. 4.

FIG. 5 is a schematic circuit diagram of the first-stage frequency divider 21a shown in FIG. 4. As seen from this detailed diagram, the divider 21a is composed of the following components: six inverters 60, 63, 64, 66, 68, and 69, two complementary metal-oxide semiconductor (CMOS) switches 61 and 65, and two n-channel MOS field effect transistors (MOSFETs) 62 and 67. The divider 21a divides its input clock signal by two after being reset by a power-on reset signal.

Figure 6:
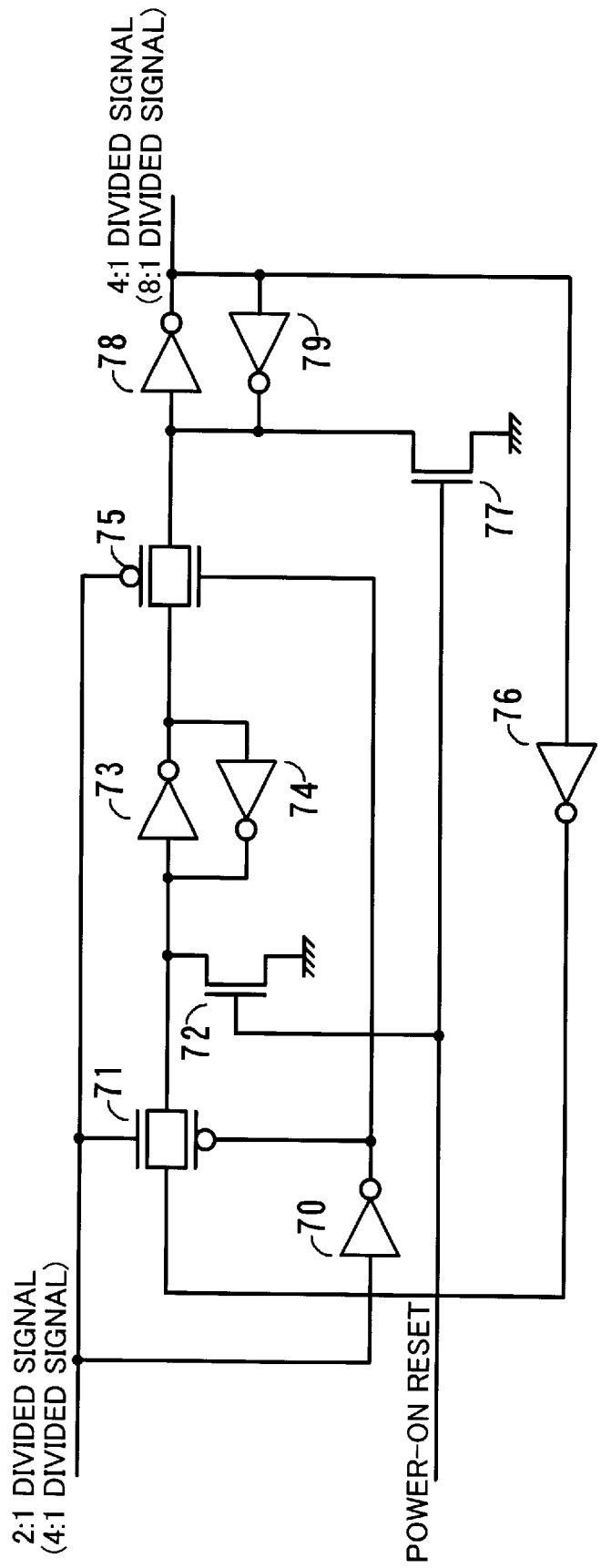
FIG. 6 is a schematic circuit diagram of a second-stage and third-stage frequency dividers in FIG. 4.

FIG. 6 is a schematic circuit diagram of the second- and third-stage frequency dividers 21b and 21c. As seen from this diagram, the dividers 21b and 21c are each composed of the following components: six inverters 70, 73, 74, 76, 78, and 79, two CMOS switches 71 and 75, and two n-channel MOSFETs 72 and 77. The dividers 21b and 21c divide their respective input signals (i.e., 2:1 and 4:1 divided signals) by two, after being reset by a power-on reset signal.

Figure 7:
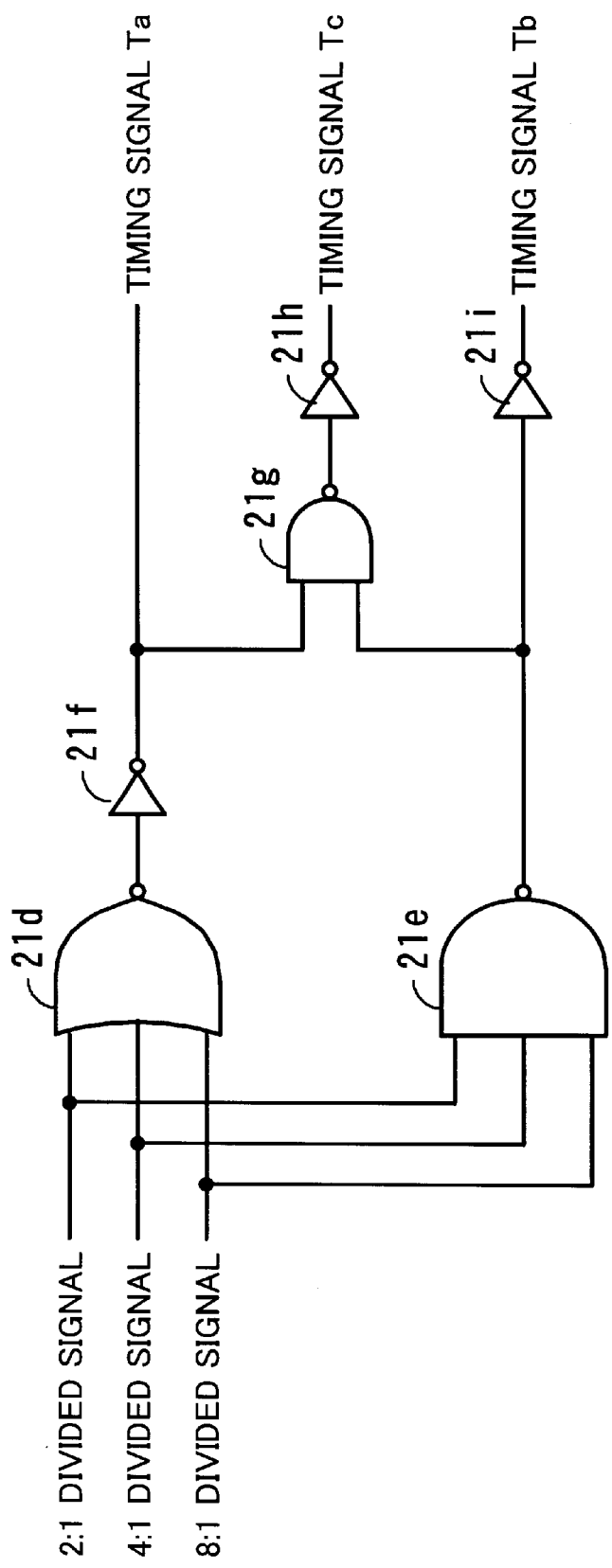
FIG. 7 is a schematic circuit diagram showing another part of the timing signal generator in FIG. 3.

FIG. 7 presents the details of another part of the timing signal generator 21 shown in FIG. 3. As this schematic circuit diagram shows, the timing signal generator 21 has a three-input NOR gate 21d, three inverters 21f, 21h, and 21i, and a three-input NAND gate 21e, and a two-input NAND gate 21g.

The NOR gate 21d performs a logical OR operation on the 2:1 divided signal, 4:1 divided signal, and 8:1 divided signal, and it outputs the result in negative logic. The three-input NAND gate 21e performs a logical AND operation on the same signals and outputs the result in negative logic. The inverter 21f inverts the output of the NOR gate 21d, thus yielding a timing signal Ta. The two-input NAND gate 21g performs a logical AND operation between the outputs of inverter 21f and NAND gate 21e and sends out the result in negative logic. The inverter 21h inverts the output of the NAND gate 21g, yielding another timing signal Tc. The inverter 21i inverts the output of the NAND gate 21e, yielding yet another timing signal Tb.

Figure 8:
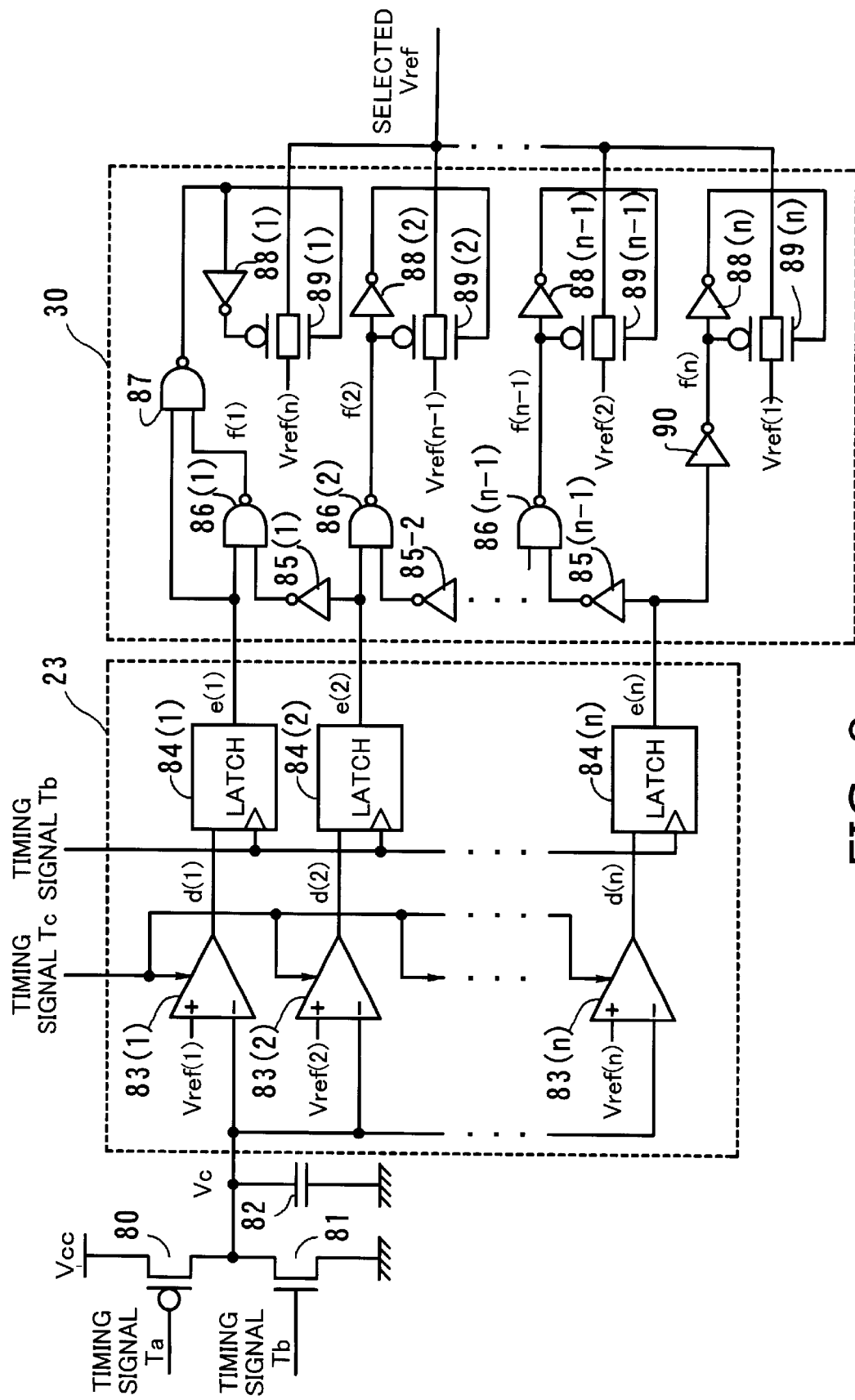
FIG. 8 is a schematic circuit diagram showing the details of a reference voltage selector in FIG. 3 and a frequency detector in FIG. 2.

FIG. 8 presents the details of the reference voltage selector 30 and frequency detector 23. As this diagram shows, the frequency detector 23 and reference voltage selector 30 are composed of the following elements: a p-channel MOSFET 80, a n-channel MOSFET 81, a capacitor 82, comparators 83(1) to 83(n), latches 84(1) to 84(n), inverters 85(1) to 85(n–1), NAND gates 86(1) to 86(n–1) and 87, inverters 88(1) to 88(n), CMOS switches 89(1) to 89(n), and an inverter 90.

In the above circuit, the p-channel MOSFET 80 turns off when the timing signal Ta is high and turns on when it is low, while the n-channel MOSFET 81 turns on when the timing signal Tb is high and turns off when it is low. The p-channel MOSFET 80, when turned on, charges the capacitor 82 toward the level of supply voltage Vcc. The n-channel MOSFET 81 in turn discharges the capacitor 82 toward zero volts when it is turned on. Note that those two MOSFETs 80 and 81 never become active at the same time.

Reference voltages Vref(1) to Vref(n) are supplied from the reference voltage generator 22 to the comparators 83(1) to 83(n), and the node voltage Vc of the capacitor 82 (or simply "capacitor voltage" Vc) is compared with each of them during a period when the timing signal Tc cable is high. The outputs of the comparators 83(1) to 83(n) are referred to by the symbols d(1) to d(n), respectively. The latches 84(1) to 84(n) capture those comparator output signals d(1) to d(n) at the rising edge of the timing signal Tb. The resultant control signals are referred to by the symbols e(1) to e(n).

In the reference voltage selector 30, the two-input NAND gates 86(1) to 86(n–1) receive the control signals e(1) to e(n–1), respectively. The inverted version of the control signals e(2) to e(n) are fed to their remaining inputs. That is, the i-th NAND gate 86-i performs a logical AND operation between the i-th latch output and the inverted version of the (i+1)th latch output and then outputs the result in negative logic. Here, i is an integer ranging from 1 to (n–1). Another NAND gate 87 performs a logical AND operation between the first latch 84(1)'s output and the NAND gate 86(1)'s output and then inverts the result.

The reference voltage selector 30 further has an array of CMOS switches 89(1) to 89(n), each consisting of a n-channel MOSFET and a p-channel MOSFET whose gates are driven by complimentary control signals produced by inverters 88(1) to 88(n). This structure is known as the CMOS transmission gate, in which n-channel and p-channel MOSFETs turn on simultaneously when their positive and negative control signals are asserted to high and low, respectively.

More specifically, in the circuit of FIG. 8, the first CMOS switch 89(1) receives its positive control signal from the NAND gate 87 and negative control signal from the inverter 88(1) to drive their n-channel and p-channel MOSFETs, respectively. This means that the CMOS switch 89(1) turns on when the output of the NAND gate 87 becomes high.

The second to (n–1)th CMOS switches 89(2) to 89(n–1) receive their respective negative control signals from the NAND gates 86(2) to 86(n–1) and positive control signals from the inverters 88(2) to 88(n–1). This means that the CMOS switches 89(2) to 89(n–1) turn on when the output of their corresponding NAND gate 86(2) to 86(n–1) becomes low.

The n-th CMOS switch 89(n) receives its negative control signal from an inverter 90 and positive control signal from another inverter 88(n). This means that the n-th CMOS switch 89(n) turns on when the output of the inverter 90 becomes low.

To sum up the above, the CMOS switches in the reference voltage selector 30 operate as follows. The first CMOS switch 89(1) turns on and outputs the n-th reference voltage Vref(n), when the output of the NAND gate 87 goes high. The second and subsequent CMOS switches 88(2) to 88(n–1) turn on when their associated NAND gates 86(2) to 86(n–1) output a low level signal, thus transferring the reference voltages Vref (n–1) to Vref(2), respectively. The n-th CMOS switch 89(n) turns on and sends out the first reference voltage Vref(1) when the output of the inverter 90 goes low. Note that no more than one CMOS switch can be activated at the same time.

Figure 9:
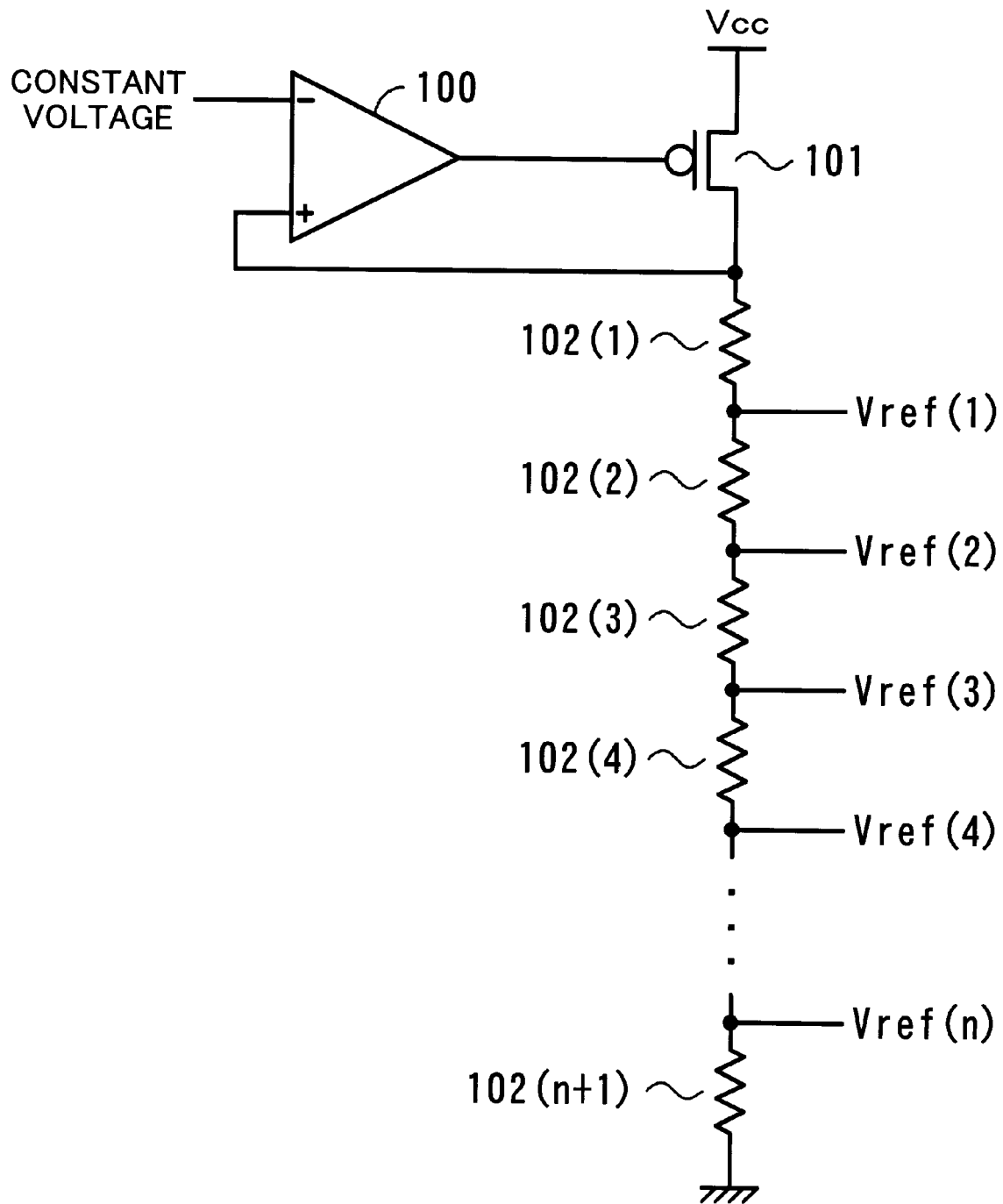
FIG. 9 is a schematic circuit diagram showing the details of a reference voltage generator in FIG. 3.

FIG. 9 presents the details of the reference voltage generator 22 shown in FIG. 3. As seen from this schematic circuit diagram, the reference voltage generator 22 is composed of an amplifier 100, a p-channel MOSFET 101, and a plurality of resistors 102(1) to 102(n+1) connected in series.

The amplifier 100, in combination with the p-channel MOSFET 101, serves as a buffer for a fixed voltage provided from a constant voltage source (not shown). This voltage is applied to one end of the dividing resistor network, the other end of which is connected to the ground. The dividing resistors 102(1) to 102(n+1) thus produce successively reduced reference voltages Vref(1) to Vref(n), with respect to the ground potential.

Figure 2:
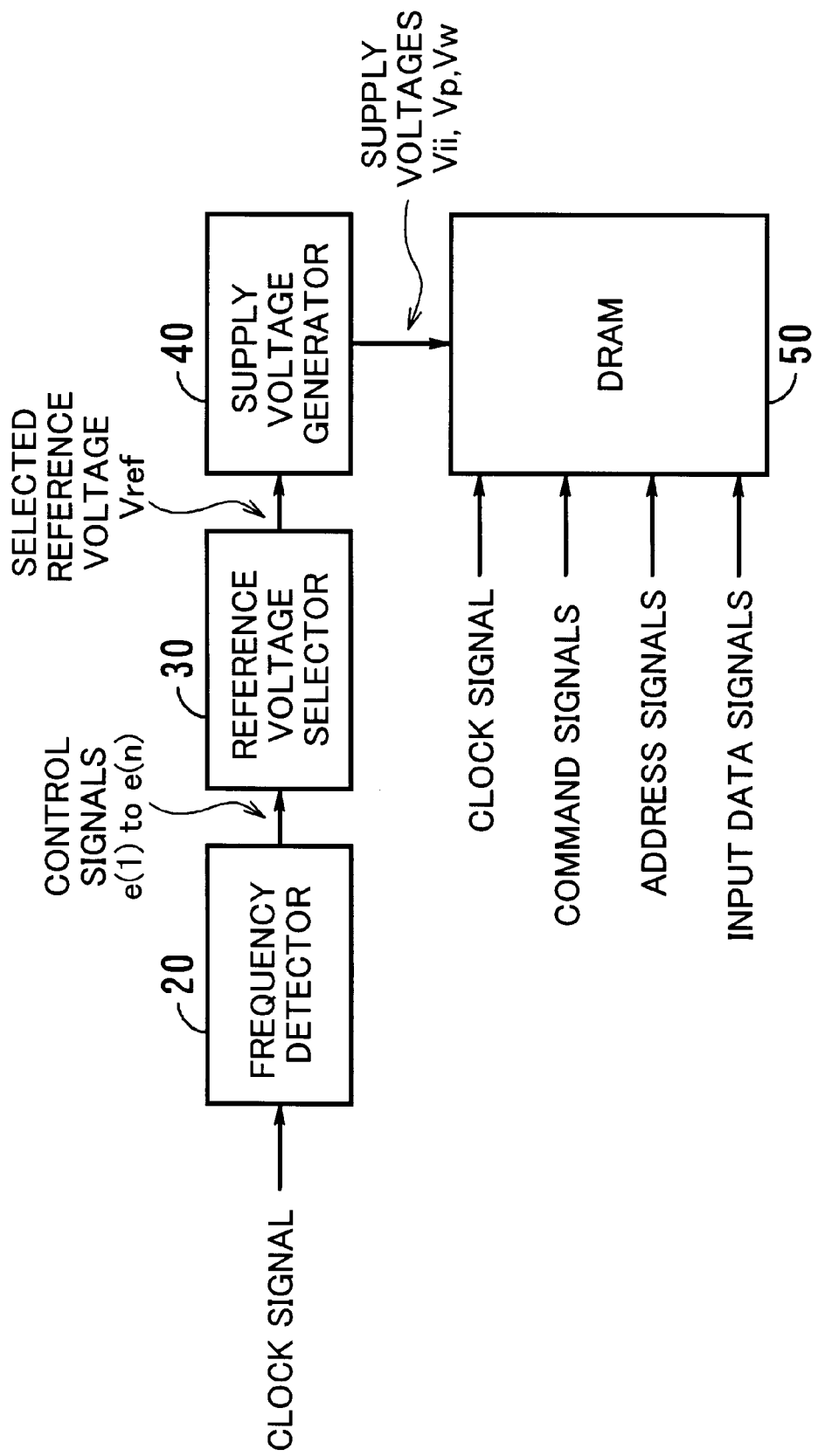
FIG. 2 is a block diagram of a first embodiment of the present invention.
Figure 10:
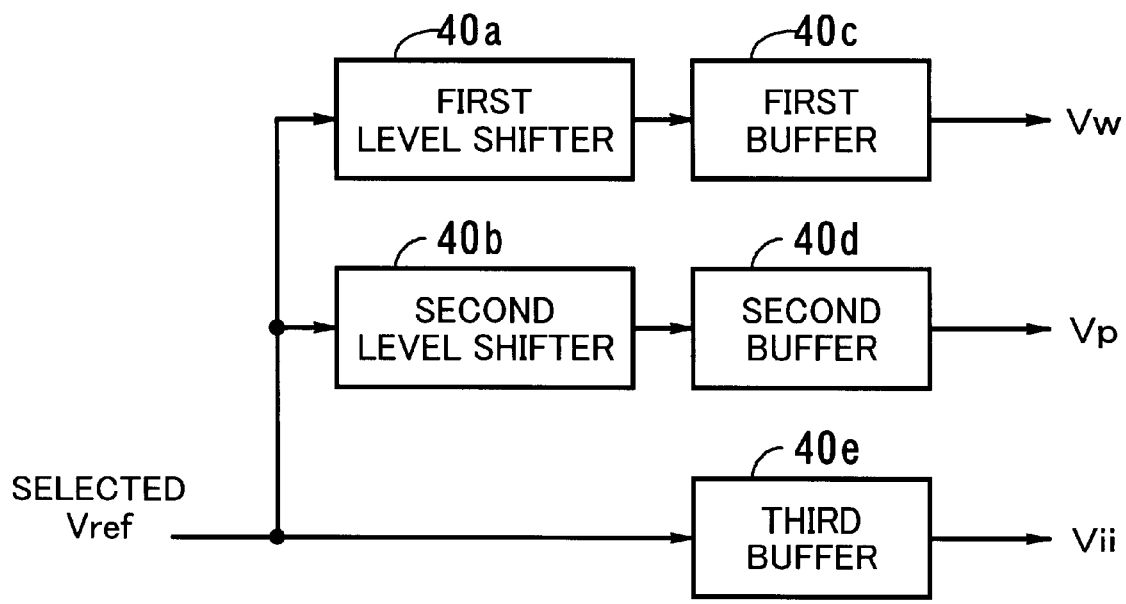
FIG. 10 is a block diagram of a supply voltage generator in FIG. 2.

FIG. 10 is a block diagram of the supply voltage generator 10 shown in FIG. 2. This supply voltage generator 40 receives a reference voltage Vref from the reference voltage selector 30 and uses it to produce the following three different supply voltages: Vw for DRAM word lines, VP for peripheral circuits, and Vii for DRAM cells and sense amplifiers. Actually, the voltage Vii is equal to the reference voltage Vref, while Vw and Vp are not.

As seen from FIG. 10, the supply voltage generator 40 is composed of two level shifters 40a and 40b and three buffers 40c to 40e. The level shifters 40a and 40b add predetermined offsets to the given reference voltage Vref, thus producing higher voltages Vw and Vp (Vw>Vp>Vii). The buffers 40c to 40e are unity-gain amplifiers that boost the current output (or convert the impedance of each source) to drive the load of each voltage Vw, Vp, and Vii.

Figure 11:
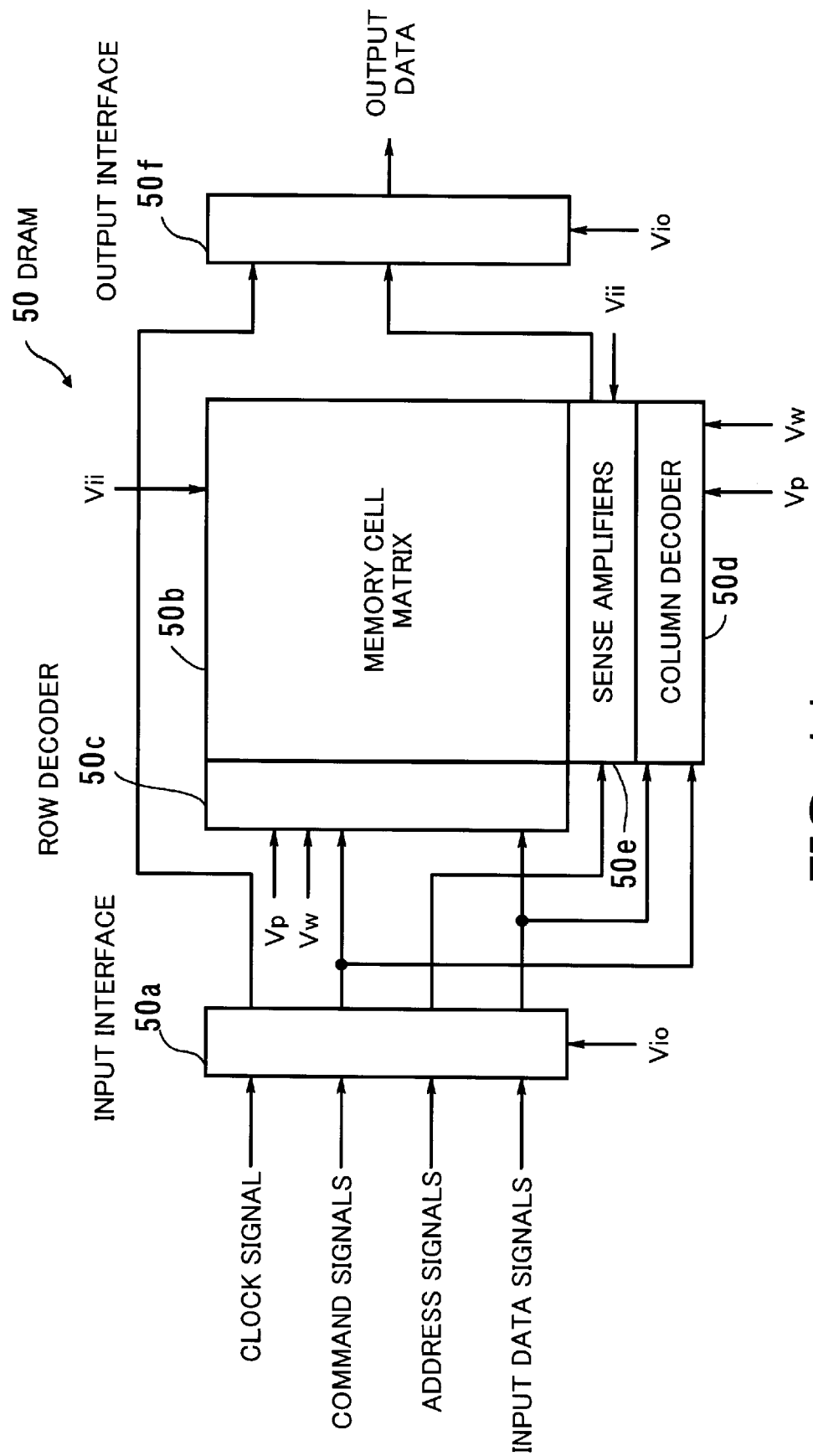
FIG. 11 is a block diagram of a dynamic RAM (DRAM) section in FIG. 2.

FIG. 11 presents the details of the DRAM 50 shown in FIG. 2. The DRAM 50 comprises the following functional blocks: an input interface 50a, a memory cell matrix 50b, a row decoder 50c, a column decoder 50d, sense amplifiers 50e, and an output interface 50f.

The input interface 50a is composed of input buffers and latches to receive a clock signal, command signals, address signals, and input data signals and distribute them to relevant circuit portions in the DRAM 50. The memory cell matrix 50b consists of a plurality of memory cells arranged in matrix form, each containing a capacitor and a circuit to control its electrical charge, to store and output data at an address designated by the row decoder 50c and column decoder 50*d*. The row decoder 50*c* decodes a given row address to select a particular row of the memory cell matrix 50*b*. The column decoder 50*d* decodes a given column address to select a particular column of the memory cell matrix 50*b*. The sense amplifiers 50*e* amplify the outputs of memory cells up to a certain voltage level, so that they can be handled as digital data. The output interface 50*f* contains buffers and other circuits to output the memory data read out and amplified by the sense amplifiers 50*e*.

The above functional blocks of the DRAM 50 operate with different supply voltages. More specifically, the input interface 50*a* and output interface 50*f* are supplied with Vio, the supply voltage for I/O circuits. The row decoder 50*c* and column decoder 50*d* are supplied with Vp for peripheral circuits and Vw for word lines. The memory cell matrix 50*b* and sense amplifiers 50*e* are supplied with Vii.

The proposed structure of a semiconductor memory device has been explained in FIGS. 2 to 11. Referring now to the timing diagrams of FIGS. 12 and 13, the next section will describe how this device operates.

Figure 12:
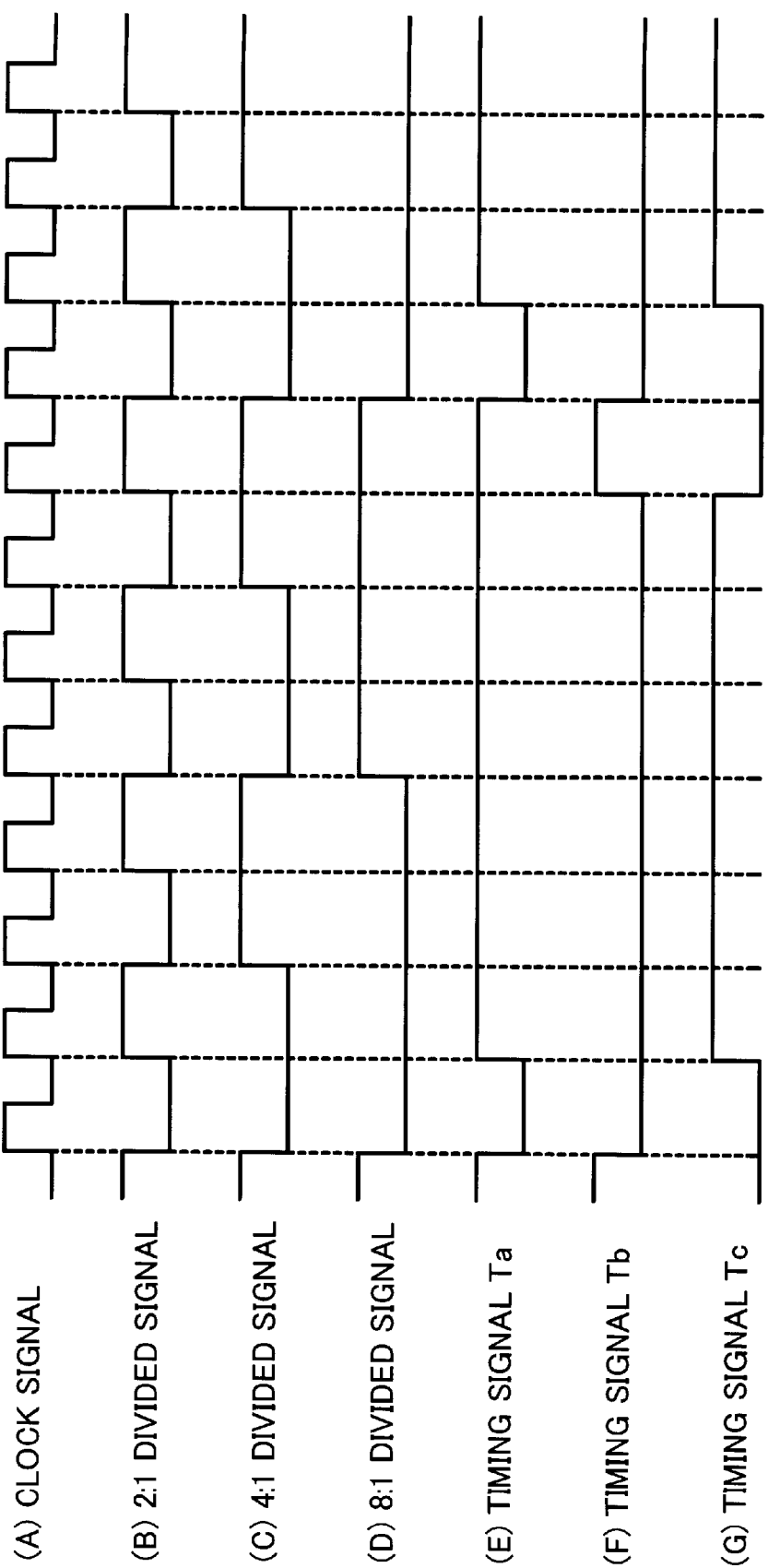
FIGS. 12 and 13 are timing diagrams which show how the first embodiment of the present invention works.

FIG. 12 explains how the control signals Ta, Tb, and Tc are produced. The memory device receives a clock signal shown in part (A) of FIG. 12, which is delivered to the timing signal generator 21 and frequency detector 23. The timing signal generator 21 divides the clock signal with its first-stage frequency divider 21*a* (FIG. 5). This results in a 2:1 divided signal shown in part (B) of FIG. 12, which is then supplied to the second-stage frequency divider 21*b* (FIG. 6), as well as to the NOR gate 21*d* and NAND gate 21*e* (FIG. 7).

The second-stage frequency divider 21*b* (FIG. 6) further divides the 2:1 divided signal, providing the NOR gate 21*d* and NAND gate 21*e* with a 4:1 divided signal shown in part (C) of FIG. 12. The third-stage frequency divider 21*c* (FIG. 6) further divides the 4:1 divided signal, thereby providing the NOR gate 21*d* and NAND gate 21*e* with an 8:1 divided signal shown in part (D) of FIG. 12.

The NOR gate 21*d* detects a period when the three divided signals (B), (C), (D) are all low and indicates it in positive logic. The inverter 21*f* inverts this signal to yield a negative pulse signal shown in part (E) of FIG. 12. The resultant signal, referred to as the first timing signal Ta, drives the gate of the p-channel MOSFET 80 of the frequency detector 23.

The NAND gate 21*e*, on the other hand, detects a period when they are all high and indicates it in negative logic. The inverter 21*i* inverts this signal to yield a positive pulse signal shown in part (F) of FIG. 12, which is referred to as the second timing signal Tb and used to drive the gate of the n-channel MOSFET 81 and latches 84(1) to 84(*n*).

The NAND gate 21*g* combines the above two periods and outputs the result in positive logic. The inverter 21*h* inverts this signal to yield a negative pulse signal shown in part (G) of FIG. 12. This signal, referred to as the third timing signal Tc, enables the comparators 83(1) to 83(*n*) in the frequency detector 23 when it is high.

Figure 13:
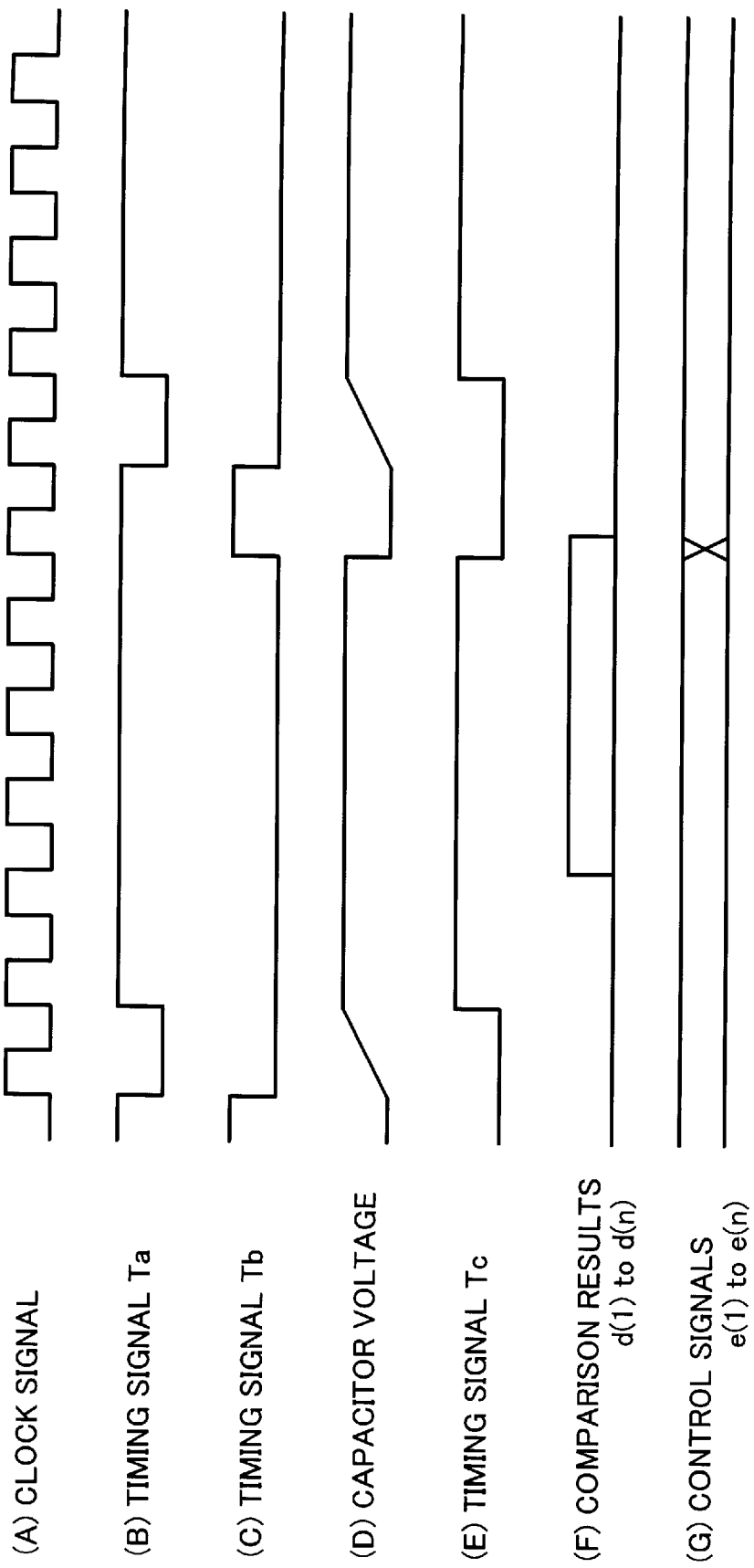

FIG. 13 is a timing diagram which shows the operation of the frequency detector 23. The p-channel MOSFET 80 turns on when the first timing signal Ta is low as shown in part (B) of FIG. 13. The n-channel MOSFET 81, on the other hand, is inactive during that period since the second timing signal Tb is low as shown in part (C) of FIG. 13. Accordingly, the capacitor 82 charges up with an incoming current from the power supply Vcc, making its voltage Vc increase as shown in part (D) of FIG. 13.

The first timing signal Ta returns to high after one clock cycle period, which turns off the p-channel MOSFET 80 again. Since the n-channel MOSFET 81 is still in an off state, the electrical charge in the capacitor 82 is preserved at the current level. Immediately after the low-to-high transition of Ta, the comparators 83(1) to 83(*n*) start their task, being enabled by the third timing signal Tc which goes high as shown in part (E) of FIG. 13. That is, the comparators 83(1) to 83(*n*) output a low level signal if the node voltage Vc of the capacitor 82 exceeds their respective reference voltages Vref(1) to Vref(n) supplied from the reference voltage generator 22 (FIG. 9). Otherwise, their outputs stay at a high level. When a certain settling time has elapsed from the low-to-high transition of Tc, the comparator outputs indicate valid comparison results d(1) to d(n) as shown in part (F) of FIG. 13.

Recall that the reference voltages Vref(1) to Vref(n) are successively small; i.e., Vref(1)>Vref(2)> . . . > Vref(n)

The i-th comparator outputs a high level signal if its reference voltage Vref(i) is higher than the capacitor voltage Vc. If not, the comparator outputs a low level signal.

Suppose, for example, that the capacitor voltage Vc is between Vref(2) and Vref(3). Then both the first and second comparison result signals d(1) and d(2) become high, while all the remaining signals d(3) to d(n) are low. The latches 84(1) to 84(*n*) capture such comparison result signals d(1) to d(n) at the next rising edge of the second timing signal Tb as shown in part (G) of FIG. 13. The captured signals are referred to as the control signals e(1) to e(n). The high level of the second timing signal Tb also turns on the n-channel MOSFET 81, thus discharging the capacitor 82 to zero, as shown in part (D) of FIG. 13.

As described previously, the i-th NAND gate 86(*i*) in the reference voltage selector 30 performs a logical AND operation between the i-th latch output e(i) and the inverted version of the (i+1)th latch output e(i+1) and then outputs the result in negative logic. In other words, the NAND gates 86(1) to 86(*n*–1) examine every pair of consecutive latch outputs to find out a critical point at which the upper latch output is high, and the lower latch output is low. This critical point is indicated by a low level output of a particular NAND gate 86(1) to 86(*n*–1) Note here that only one NAND gate becomes active (low), while the others remain inactive (high).

Now that the positive and negative controls signals of each CMOS switch are given, the reference voltage selector 30 is ready to output one of the reference voltages. More specifically, either of the second and subsequent CMOS switches 88(2) to 88(*n*–1) becomes active when their associated NAND gates 86(2) to 86(*n*–1) output a low level signal, enabling one of the reference voltages Vref(n–1) to Vref(2) to be transmitted. When the output of the NAND gate 87 is high, the first CMOS switch 89(1) turns on and outputs the n-th reference voltage Vref(n). When the output of the inverter 90 is low, the n-th CMOS switch 89(*n*) turns on and sends out the first reference voltage Vref(1).

In the present example, the first two latch outputs e(1) and e(2) are high, while all the other outputs e(3) to e(n) are low, because the capacitor voltage Vc lies between Vref(2) and Vref(3). This causes the second NAND gate 86(2) to output a low-level signal. All the other NAND gates 86(1) and 86(3) to 86(*n*–1) output a high-level signal, as does the inverter 90. Accordingly, the second CMOS switch 89(2) is selectively activated, thus making the Vref(n–1) appear on the Vref output line.

To sum up the above operation, the frequency detector 23 compares the capacitor 82's node voltage Vc with multiple reference voltages Vref(1) to Vref(n) simultaneously, and based on the result of that comparison, the reference voltage selector 30 selects one of the reference voltages Vref(n) to Vref(1). Here, the reference voltage selector 30 is designed to choose a lower reference voltage for a higher charge in the capacitor 82. Conversely, a higher reference voltage is selected for a lower charge in the capacitor 82. It should be noted that the amount of the charge depends on the frequency of the clock signal being supplied. The lower the frequency is, the more the capacitor 82 charges up. This mean that a lower voltage is selected as Vref for a lower clock frequency, and conversely, a higher voltage is selected for a higher clock frequency.

The selected reference voltage Vref is supplied from the reference voltage selector 30 to the first and second level shifters 40a and 40b, as well as to the third buffer 40e in the supply voltage generator 40. The third buffer 40e amplifies the reference voltage by a unity gain for use as Vii in the memory cell matrix 50b and sense amplifiers 50e of the DRAM 50 (FIG. 11).

The second level shifter 40b gives a predetermined amount of level shift to the given reference voltage Vref. The second buffer 40d amplifies the resultant voltage Vp by a unity gain for use in the row decoder 50c and column decoder 50d of the DRAM 50 (FIG. 11).

The first level shifter 40a gives another predetermined amount of level shift to the given reference voltage Vref. The subsequent buffer 40c amplifies the resultant voltage Vw by a unity gain for use as word line potential in the row decoder 50c and column decoder 50d of the DRAM 50 (FIG. 11).

Figure 14:
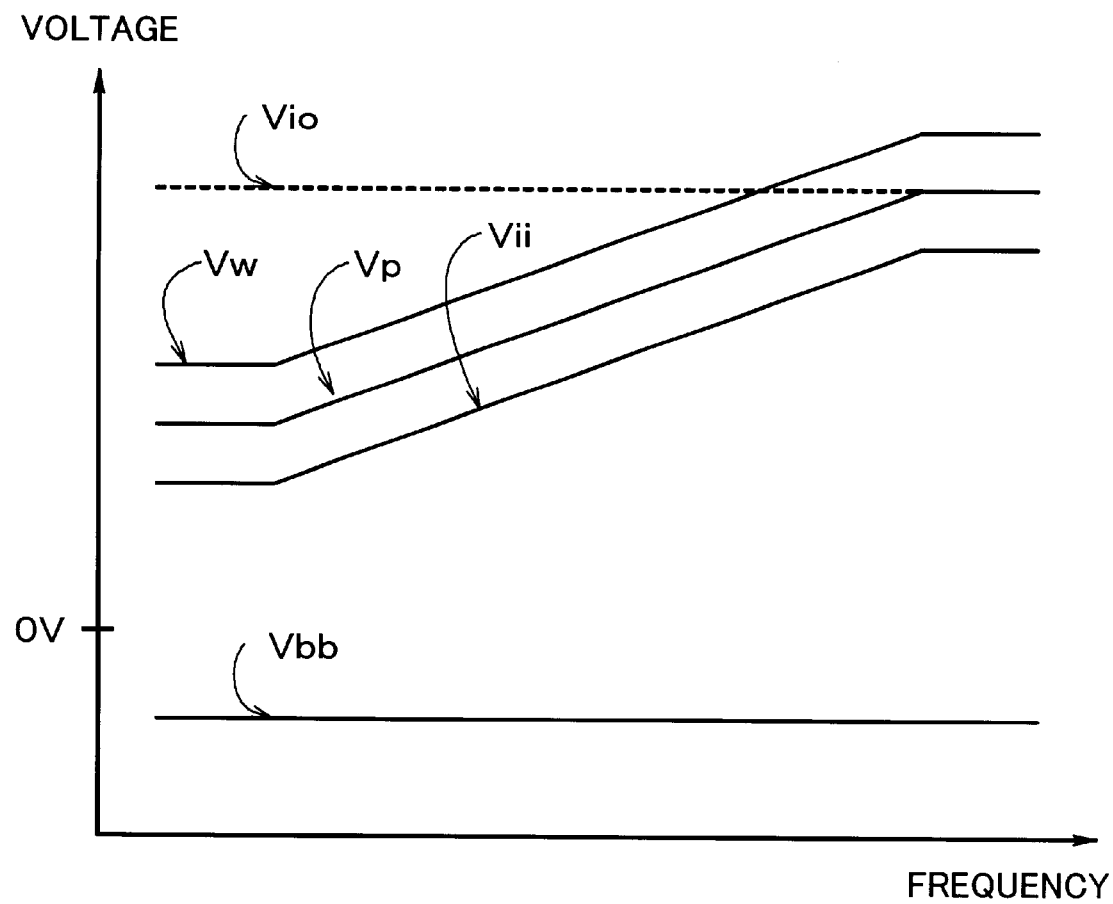
FIG. 14 shows the relationship between clock frequency and supply voltages produced by the first embodiment of the present invention.

FIG. 14 shows the relationship between the clock frequency and each supply voltage provided by the buffers 40c to 40e shown in FIG. 10, including Vw for word line potential, Vp for peripheral circuits, and Vii for memory cells. As seen from this graph, Vw is the highest of the three variable voltages, followed by Vp and then Vii. The proposed circuit varies those voltages Vw, Vp, and Vii in accordance with the clock frequency while maintaining their relative voltage differences. The voltages are simultaneously raised as the clock frequency goes up. Conversely, they are simultaneously reduced as the clock frequency goes down.

FIG. 14 also shows a back-bias voltage Vbb and a supply voltage Vio for the input interface 50a and output interface 50f. Vio and Vbb are produced by a dedicated power supply, separately from the supply voltage generating circuit of the present invention. Particularly, Vio has to be a fixed voltage, not affected by the clock frequency, because it is used in the interface with peripheral devices.

To sum up the above-described first embodiment of the present invention, a series of reference voltages are produced with a plurality of voltage dividing resistors, and appropriate supply voltages are generated from one of the reference voltages that is selected on basis of the clock frequency. This feature of the present invention enables supply voltages to be fine-tuned according to the variation of clock frequency.

The present embodiment employs level shifters to produce two or more supply voltages from a single reference voltage for use in several different circuit blocks in a DRAM 50. This configuration permits two or more circuit blocks to operate with different voltages that are appropriately tuned according to variations of clock frequency.

Figure 15:
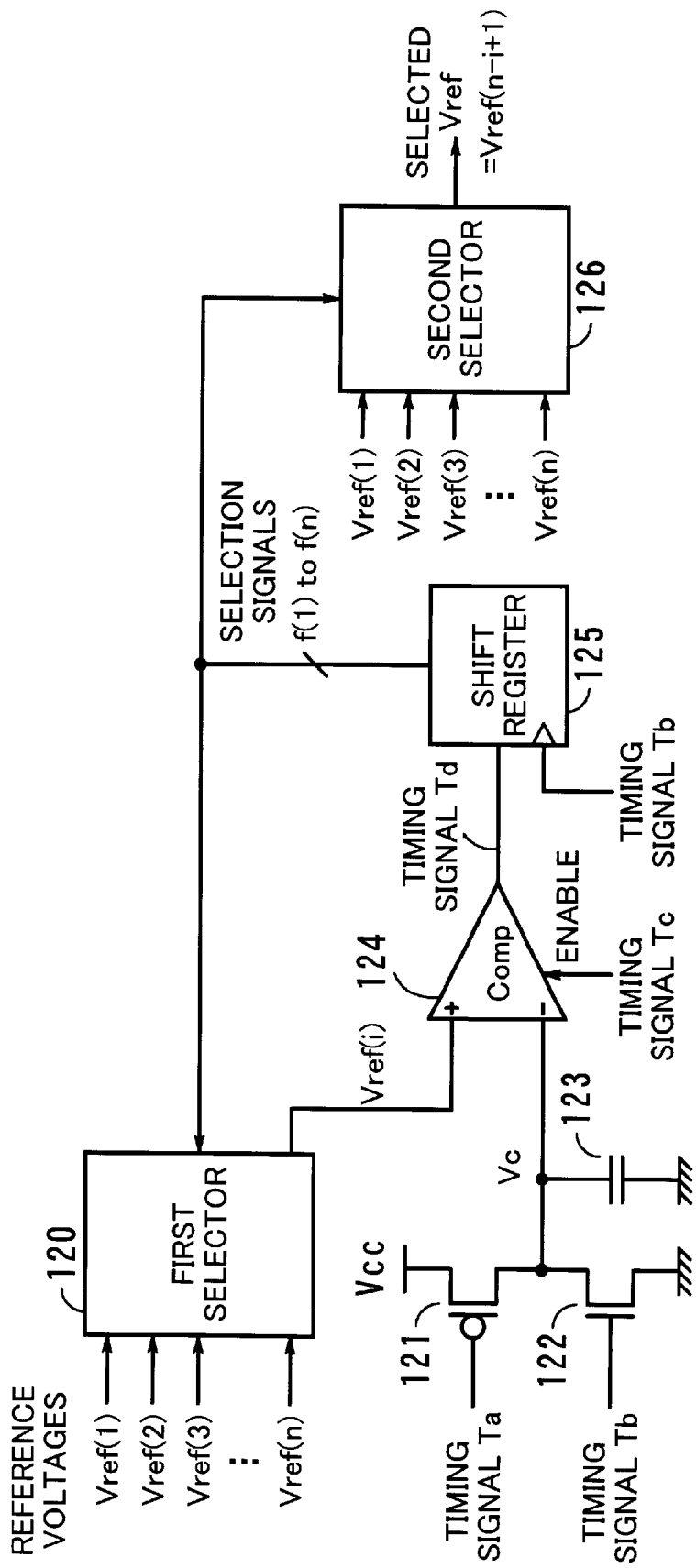
FIG. 15 shows another configuration of the frequency detector in FIG. 2.

Referring next to FIG. 15, another implementation of the frequency detector 20 will be described. As seen from this block diagram, this frequency detector comprises a first selector 120, a p-channel MOSFET 121, a n-channel MOSFET 122, a capacitor 123, and a comparator 124, a shift register 125, and a second selector 126.

The reference voltage generator 22 (FIG. 3) produces a series of reference voltages Vref(1) to Vref(n) The first selector 120 selects one of them according to selection signals f(1) to f(n) supplied from the shift register 125.

The p-channel MOSFET 121 turns on when the timing signal Ta is low and turns off when it is high. The n-channel MOSFET 122, on the other hand, turns on when the timing signal Tb is high and turns off when it is low. The capacitor 123 is connected to the common drain of the two MOSFETs 121 and 122. The p-channel MOSFET 121, when turned on, charges the capacitor 123 toward the supply voltage Vcc. The n-channel MOSFET 122 in turn discharges the capacitor 123 toward zero volts when it is turned on. Note that those two MOSFETs 121 and 122 never become active at the same time.

The comparator 124 is enabled when the timing signal Tc is high, during which it compares the node voltage Vc of the capacitor 123 with the reference voltage Vref(i) that is supplied from the first selector 120. The comparison result is sent to the shift register 125 as a control signal Td. When this comparator output signal Td is high, it indicates that the capacitor voltage Vc is lower than the reference voltage Vref(i) that is currently chosen by the first selector 120. When Td is low, it indicates that Vc is higher than Vref(i).

The above control signal Td is supplied to the shift register 125. The shift register 125 outputs selection signals f(1) to f(n) for use in the first and second selectors 120 and 126. Of those signals f(1) to f(n), only one signal can be set to high, and that register bit position is determined by the control signal Td. Actually, the current "high" bit position i causes the first selector 120 to select the i-th reference voltage Vref(i).

Hereafter, the term "shift count" will be used to refer to the "high" bit position. In the circuit of FIG. 15, the shift count will be incremented from i to (i+1) when Td is high (i.e., Vc is lower than Vref(i)). Conversely, the shift count will be decremented from i to (i−1) when Td is low (i.e., Vc is higher than Vref(i)). In either case, the shift register 125 updates the "high" bit position of the selection signals at the rising edge of its clock input, i.e., the timing signal Tb.

As noted above, the first selector 120 supplies the comparator 124 with a reference voltage specified by the selection signals f(1) to f(n) that the shift register 125 provides. Suppose, for example, that the current shift count is three. This means that the third selection signal f(3) is set to high, and the first selector 120 outputs the third reference voltage Vref(3).

The second selector 126 also outputs one of the reference voltages Vref(1) to Vref(n) as the selection signals f(1) to f(n) specify. Unlike the first selector 120, however, the second selector 126 selects a voltage at the reverse bit position. That is, when f(i) is high, it selects the (n−i+1)th reference voltage, instead of the i-th voltage. In the present example, the second selector 126 selects Vref(n−2) since the shift register 125 sets f(3) to high.

Referring now to the timing diagram of FIG. 16, the operation of the modified version of the first embodiment will be described. Note that the following explanation still assumes the base structure of the first embodiment described earlier, except the reference voltage selection mechanism discussed in FIG. 15. For details of other elements and signals, see earlier part of the description.

Figure 16:
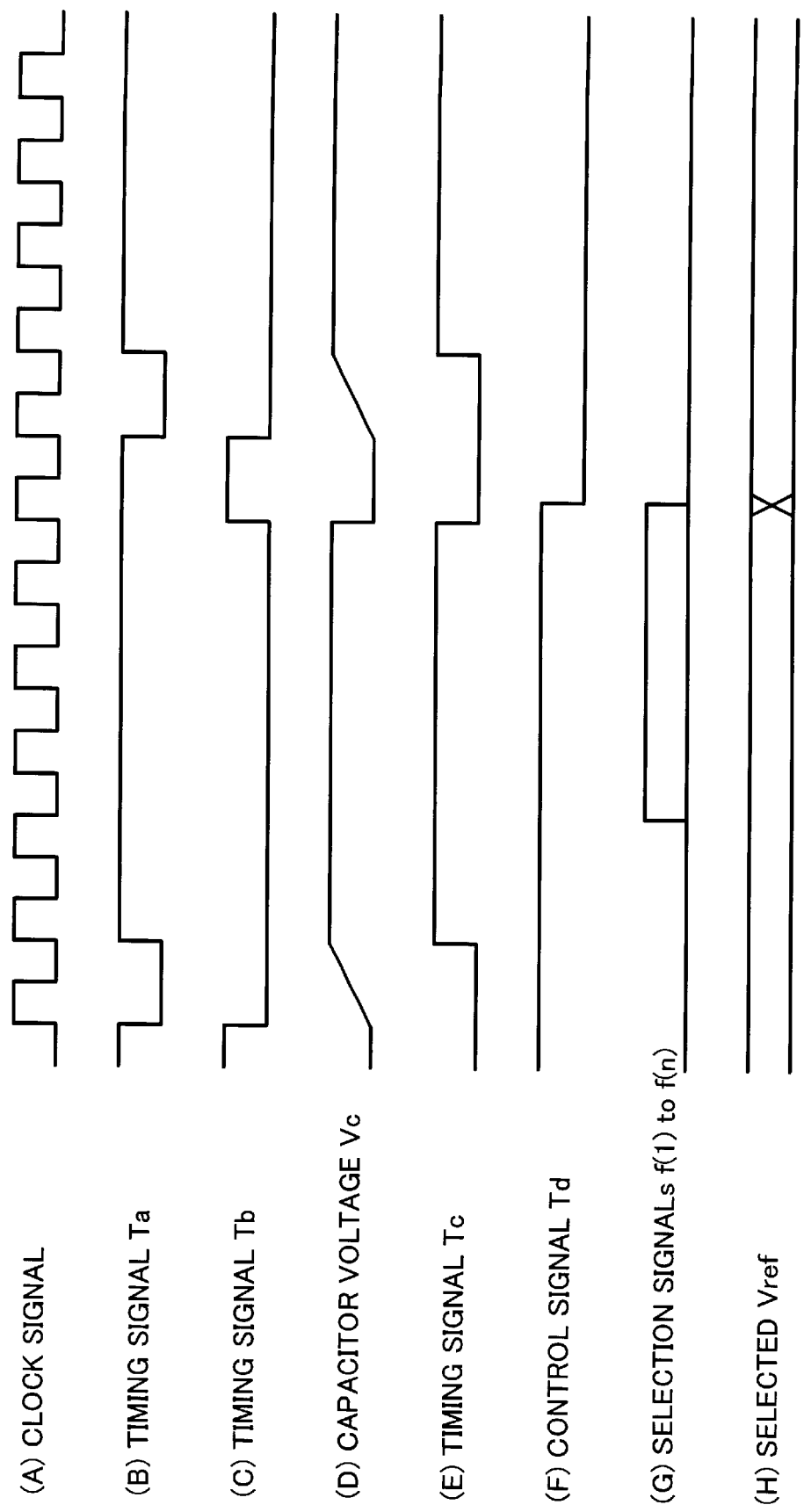
FIG. 16 is a timing diagram showing the operation of the circuit of FIG. 15.

The timing signal generator 21 creates timing signals Ta, Tb, and Tc from a clock signal shown in part (A) of FIG. 16, which are distributed to the p-channel MOSFET 121, n-channel MOSFET 122, shift register 125, and comparator 124. When the first timing signal Ta goes low as shown in part (B) of FIG. 16, the p-channel MOSFET 121 turns on and begins to charge the capacitor 123. As a result of the current flowing into the capacitor 123 from Vcc, the node voltage Vc increases gradually as depicted in part (D) of FIG. 16.

After one clock cycle period, the timing signal Ta returns to high, thus turning off the p-channel MOSFET 121 and stopping the current flow to the capacitor 123. Since the n-channel MOSFET 122 is still in an off state due to its low gate input, the charge in the capacitor 123 is held at the current level.

Now the third timing signal Tc becomes high as shown in part (E) of FIG. 16, causing the comparator 124 to start its operation. It compares the capacitor 123's node voltage Vc with the currently selected reference voltage Vref(i) that is supplied from the first selector 120. Initially, the shift register 125 sets its first bit to one (i.e., i=1), which makes the first selector 120 output the highest reference voltage Vref(1). If the capacitor voltage Vc is lower than Vref(1), the comparator 124 makes its output signal Td high, and therefore, the shift register 125 increments its shift count i from one to two at the next rising edge of the second timing signal Tb. As a result, the first selector 120 outputs a new reference voltage Vref(2), which is lower than the previous reference voltage Vref(1). The high level state of the second timing signal Tb also turns on the n-channel MOSFET 122, thus discharging the capacitor 123 to zero as shown in part (D) of FIG. 16.

The above operation is repeated at intervals of eight clock cycles, allowing the selected reference voltage Vref(i) to approach the actual capacitor voltage Vc. When the selected reference voltage Vref(i) falls below the capacitor voltage Vc, the comparator 124 outputs a low level signal. In this case, the shift register 125 decrements its shift count i by one at the next rising edge of the timing signal Tb, thus lowering the reference voltage.

As the shift register 125 changes its active selection signal, the second selector 126 updates Vref in reverse order. That is, the second selector 126 chooses an appropriate Vref from among the same set of reference voltages according to the same selection signals supplied by the shift register 125, but it assumes the opposite voltage order to what the first selector 120 uses.

After all, the circuit of FIG. 15 brings about the following results. When the clock frequency is high, the node voltage Vc of the capacitor 123 is reduced because of its shorter charging time, causing the first selector 120 to select a lower Vref(i). The second selector 126 then outputs a higher Vref since it operates in an opposite way to the first selector 120 as noted above. On the other hand, when the clock frequency is low, the node voltage Vc of the capacitor 123 rises because of its longer charging time, causing the first selector 120 to select a higher Vref(i). The second selector 126 then outputs a lower Vref since it operates in the opposite way to the first selector 120.

As seen from the above explanation, the modified version (FIG. 15) of the first embodiment achieves the same effects as the original version (FIG. 8) does, with a smaller number of circuit elements.

Figure 17:
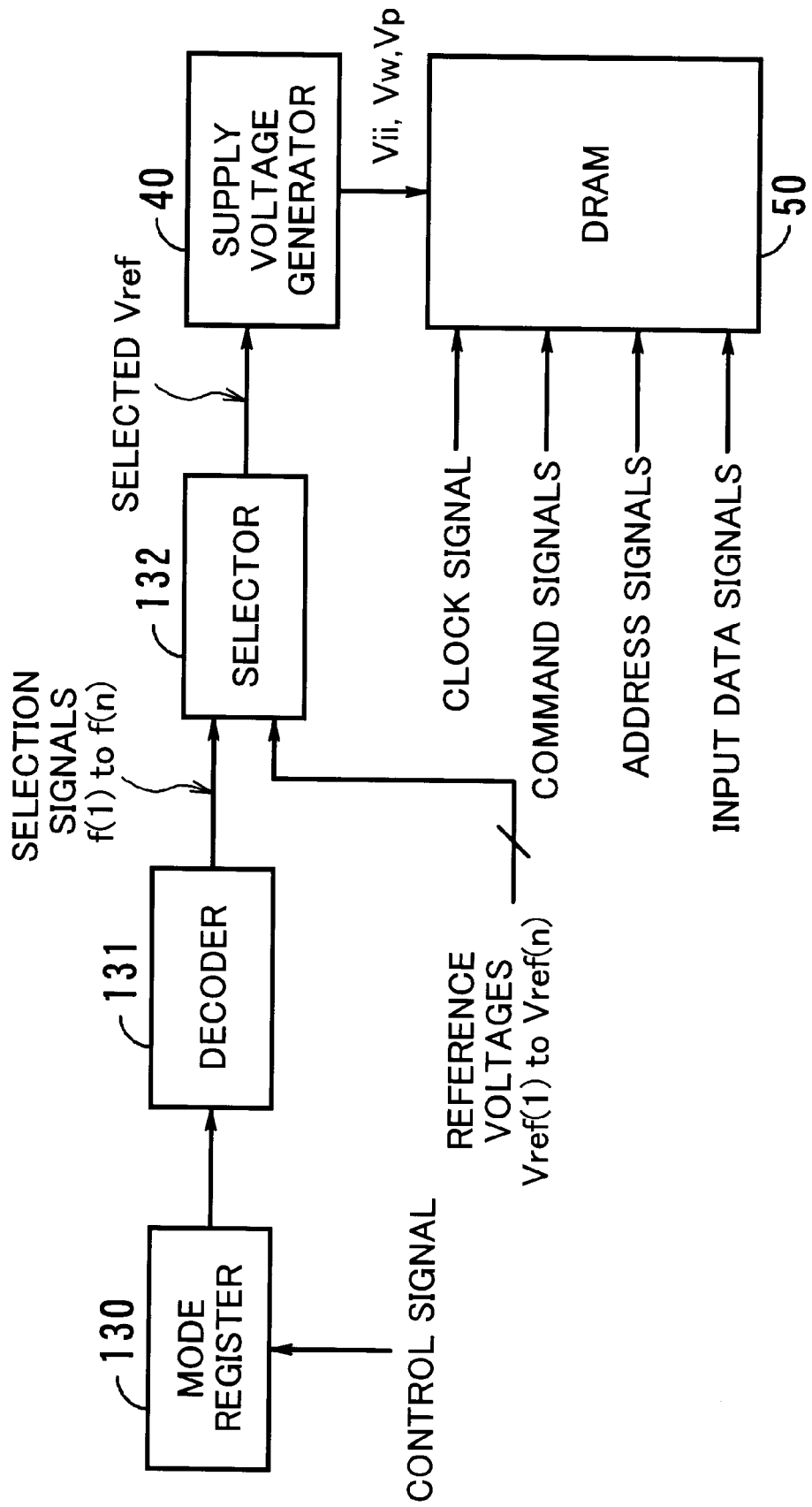
FIG. 17 is a block diagram of a second embodiment of the present invention.

Referring next to FIG. 17, another embodiment of the present invention will be described. FIG. 17 is a block diagram of a semiconductor memory device according to a second embodiment. The illustrated device shares some common functions and signals with the circuit discussed in FIG. 2. The following section will focus on its distinctive points, while affixing like reference numerals to like elements. More specifically, the second embodiment differs from the first embodiment in that it has no frequency detector 20 or reference voltage selector 30. Instead, the second embodiment employs a mode register 130, a decoder 131, and a selector 132.

The mode register 130 is a semiconductor memory or other equivalent circuit to store several data bits that are written from an external system (not shown) with some control signals. The decoder 131 decodes those data bits of the mode register 130, thus asserting one of its output signals f(1) to f(n) to high. The selector 132 uses such selection signals f(1) to f(n) to extract one of the reference voltages Vref(1) to Vref(n).

Figure 18:
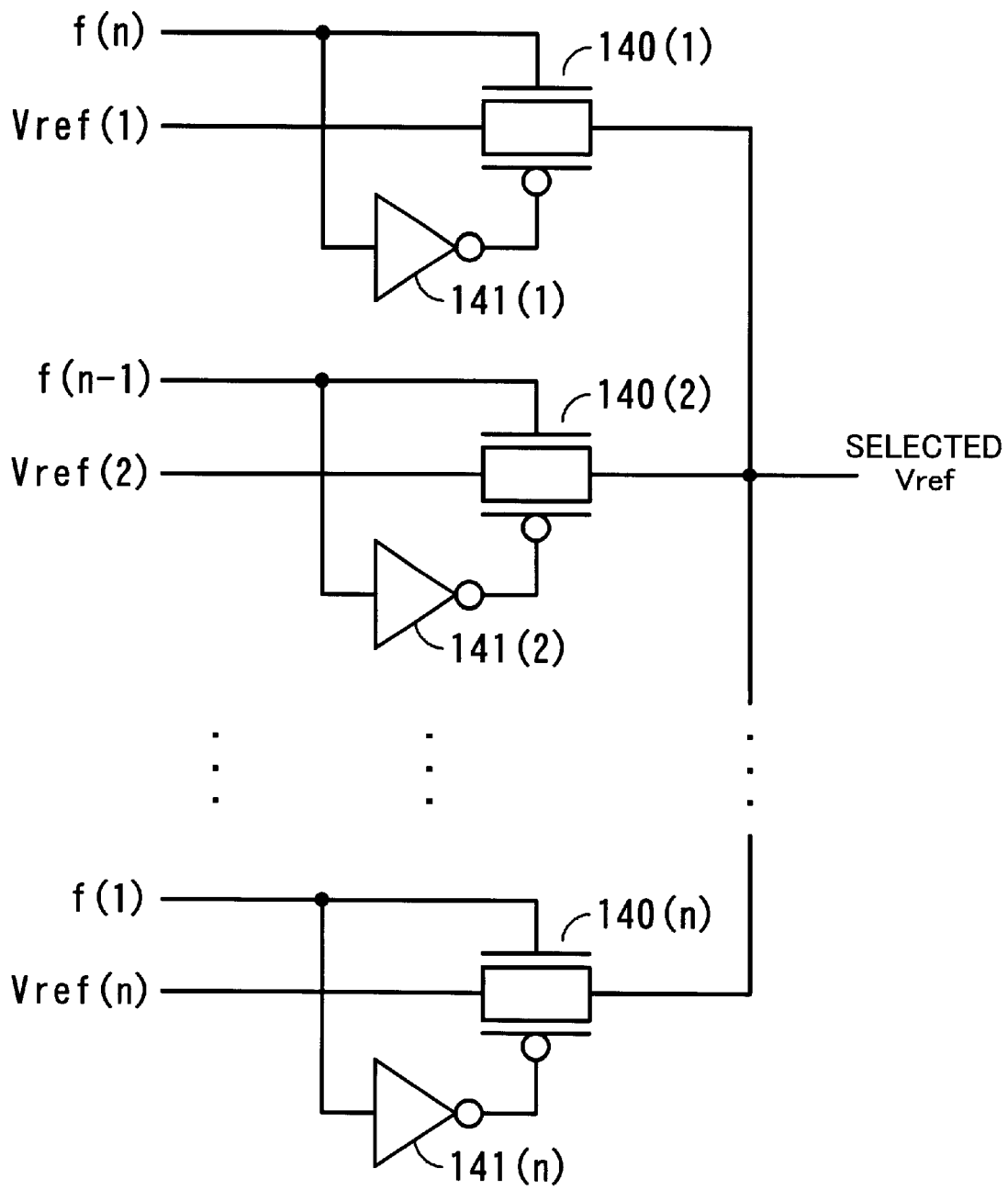
FIG. 18 is a schematic circuit diagram showing the details of a selector in FIG. 17.

FIG. 18 presents the detailed structure of the selector 132. As seen from this schematic circuit diagram, the selector 132 is composed of CMOS switches 140(1) to 140(n) and inverters 141(1) to 141(n). When one of the selection signals f(1) to f(n) is asserted to high, the corresponding CMOS switch becomes active and allows its associated reference voltage to appear at the Vref output of the selector 132.

The second embodiment of the present invention operates as follows. When the frequency of a given clock signal is identified, the external system (not shown) writes a predefined code representing that clock frequency into the mode register 130. The code has a smaller value for higher frequencies, and a larger value for lower frequencies. The decoder 131 decodes the code written in the mode register 130, asserting one of the selection signals f(1) to f(n) to high. More specifically, the decoder 131 asserts a selection signal with a smaller index number for a smaller code value, and likewise, it asserts a selection signal with a larger index number for a greater code value. The selector 132 then selects a particular reference voltage associated with the asserted selection signal. If, for example, the third selection signal f(3) is set to high, then the selector 132 chooses the (n−2)th reference voltage Vref(n−2). The supply voltage generator 40 produces three supply voltages Vw, Vp, and Vii from the selected reference voltage Vref. To achieve this, the supply voltage generator 40 has two level shifters 40a and 40b and three unity-gain buffers 40c and 40e (see earlier sections for the details of those components). As a result of the above processing, the DRAM 50 receives appropriate supply voltages that are tuned in accordance with the clock signal frequency.

To sum up, the second embodiment of the present invention is configured to produce supply voltages for a DRAM 50 in accordance with the data stored in the mode register 130. This configuration is beneficial when the clock frequency is known, since desired supply voltages can be obtained by simply writing an appropriate code to the mode register 130 to specify the frequency. In addition, the second embodiment is less complex than the first embodiment in terms of circuit structure.

Figure 19:
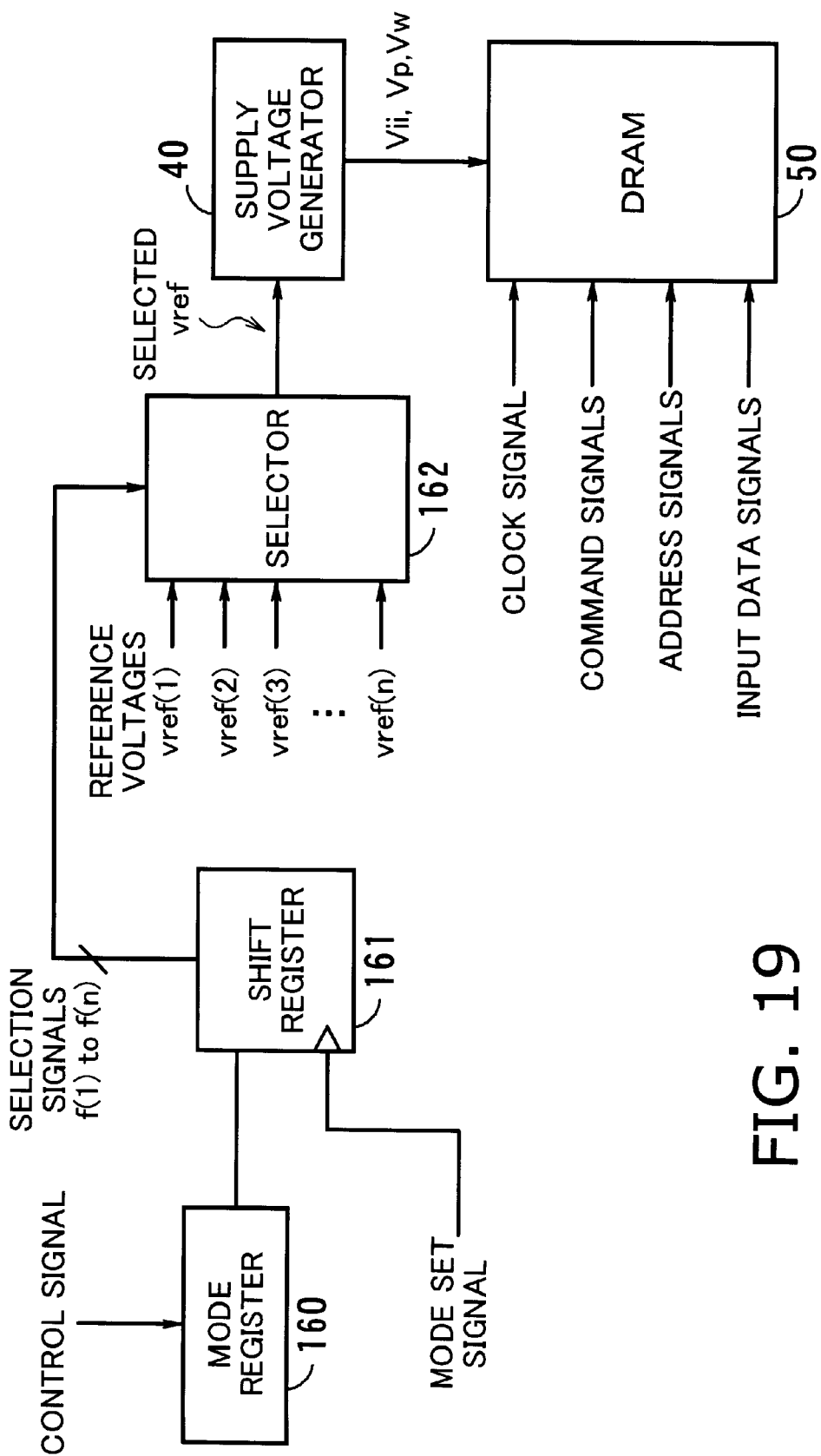
FIG. 19 is a block diagram of a third embodiment of the present invention.

Referring next to FIG. 19, another embodiment of the present invention will be described. FIG. 19 is a block diagram of a semiconductor memory device according to a third embodiment of the present invention. The illustrated device shares some common functions and signals with the circuit discussed in FIG. 2. The following section will focus on its distinctive points, while affixing like reference numerals to like elements. The third embodiment differs from the first embodiment in that it has neither frequency detector 20 nor reference voltage selector 30. Instead, the third embodiment employs a mode register 160, a shift register 161, and a selector 162.

The mode register 160 is a semiconductor memory which stores single-bit data (zero or one) given by the external system (not shown). Like the shift register 125 described in FIG. 15, the shift register 161 sets one of its selection signals f(1) to f(n) to high for use in the selector 162. In the third embodiment, however, this "high" bit position, or shift count, is controlled by the data stored in the mode register 160. That shift count will be incremented from i to (i+1) at the rising edge of a mode register set signal, when the mode register 160 is set to one. Conversely, the shift register 125 decrements the shift count from i to (i−1) when the mode register 160 is set to zero. The selector 162 selects one of the reference voltages Vref(1) to Vref (n) that is associated with the asserted selection signal.

The third embodiment operates as follows. When the clock frequency has to be raised, the system sets the mode register 160 to one and asserts the mode register set signal to high. Because the mode register 160 is set, the shift register 161 increments its shift count from i to (i+1). The new shift count (i+1) causes the selector 162 to choose the (n−i)th reference voltage for use in the supply voltage generator 40.

Suppose, for example, that the shift register 161 has changed its shift count from two to three. In this case, the selector 162 changes its output from Vref(n−1) to Vref(n−2). As this example shows, a higher reference voltage Vref is selected when the shift count is incremented. With the raised reference voltage Vref, the supply voltage generator 40 produces higher supply voltages Vw, Vp, and Vii for use in the DRAM 50 (see earlier sections for the details of the supply voltage generator 40). In this way, the system raises the supply voltages Vii, Vp, and Vw by setting the mode register 160 to one.

As seen from the above explanation, the third embodiment permits the system to fine-tune the supply voltages for the DRAM 50 by simply writing one or zero to the mode register 160.

Figure 20:
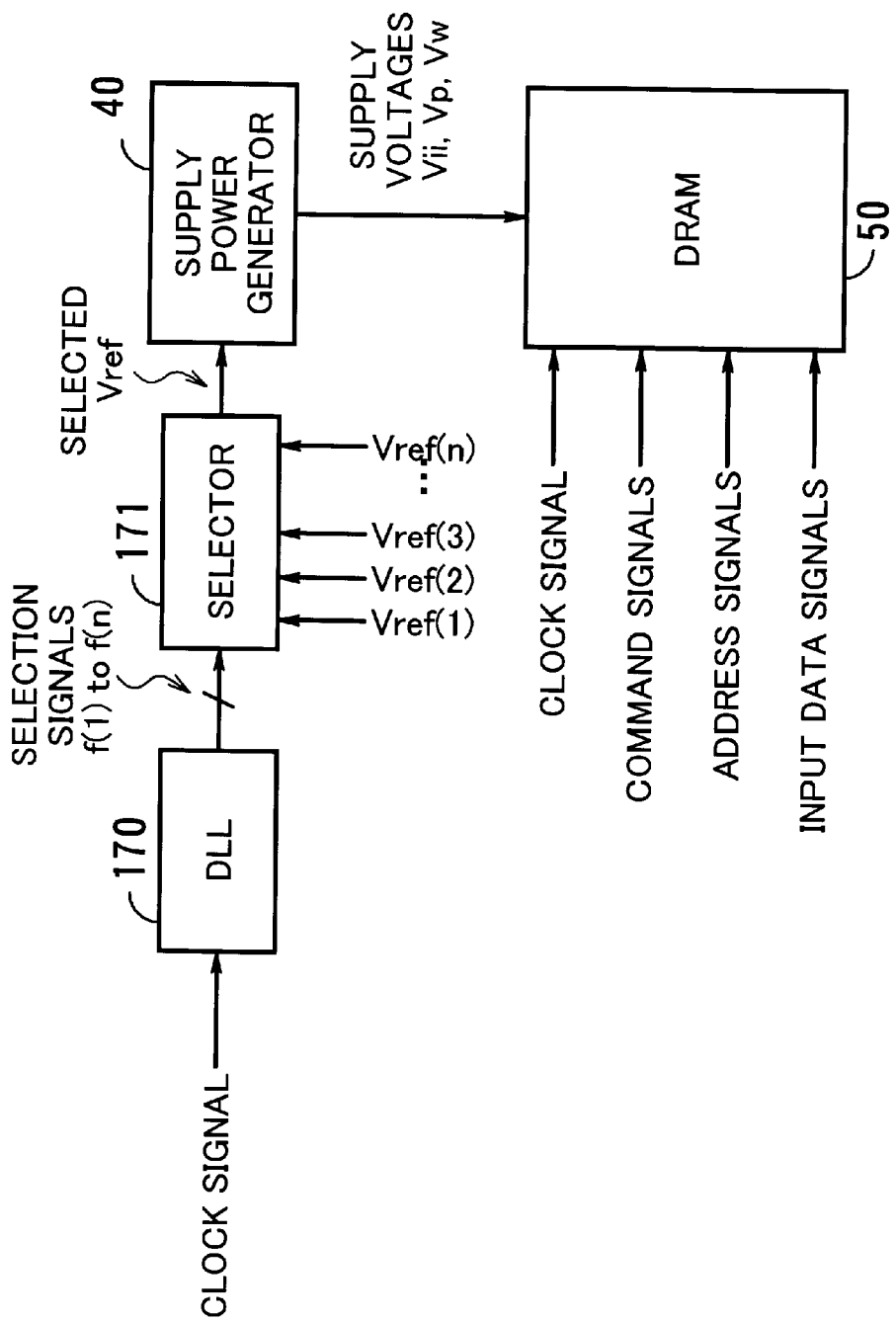
FIG. 20 is a block diagram of a fourth embodiment of the present invention.
Figure 21:
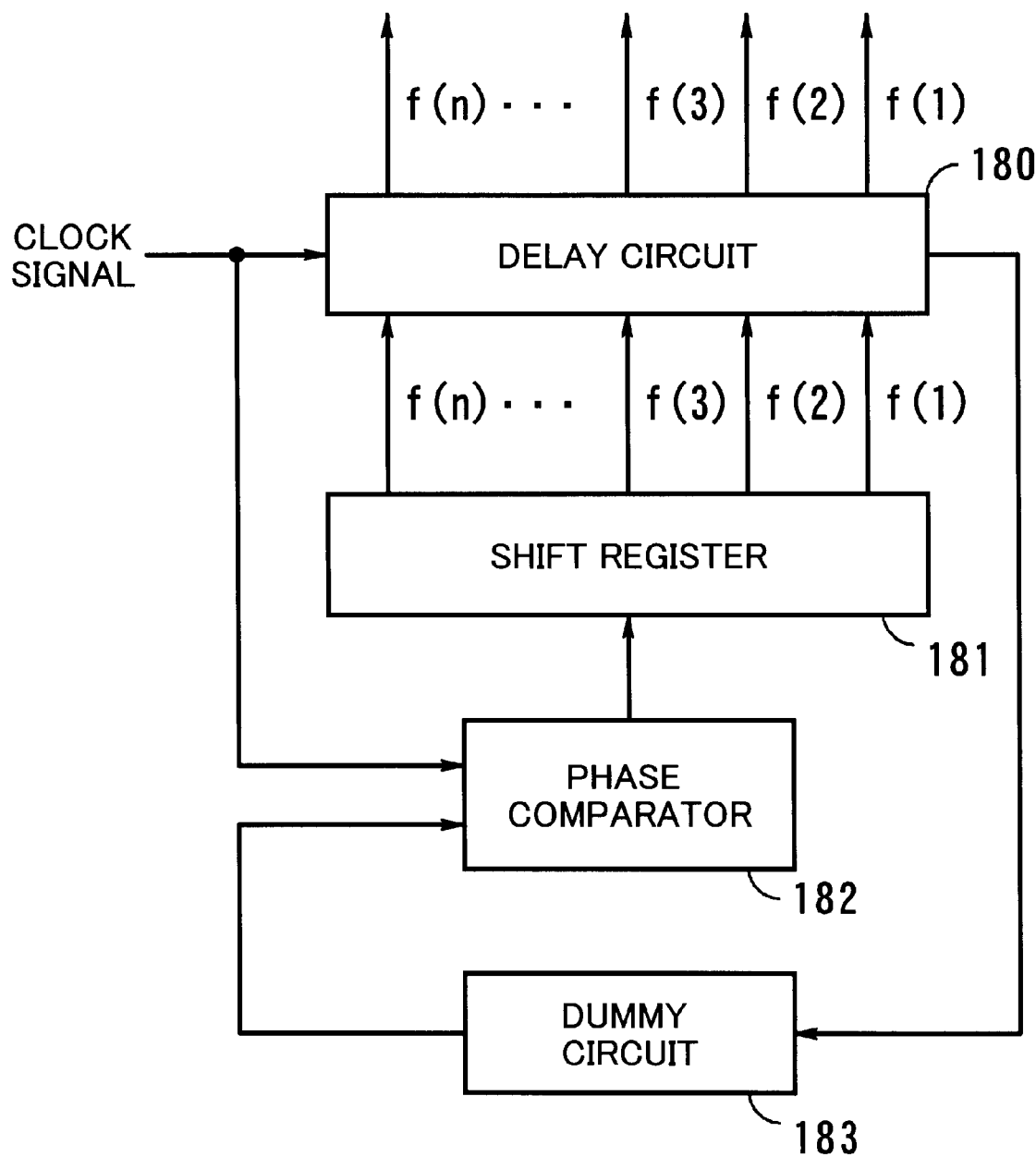
FIG. 21 is a block diagram of a delay-locked loop (DLL) in FIG. 20.
Figure 22:
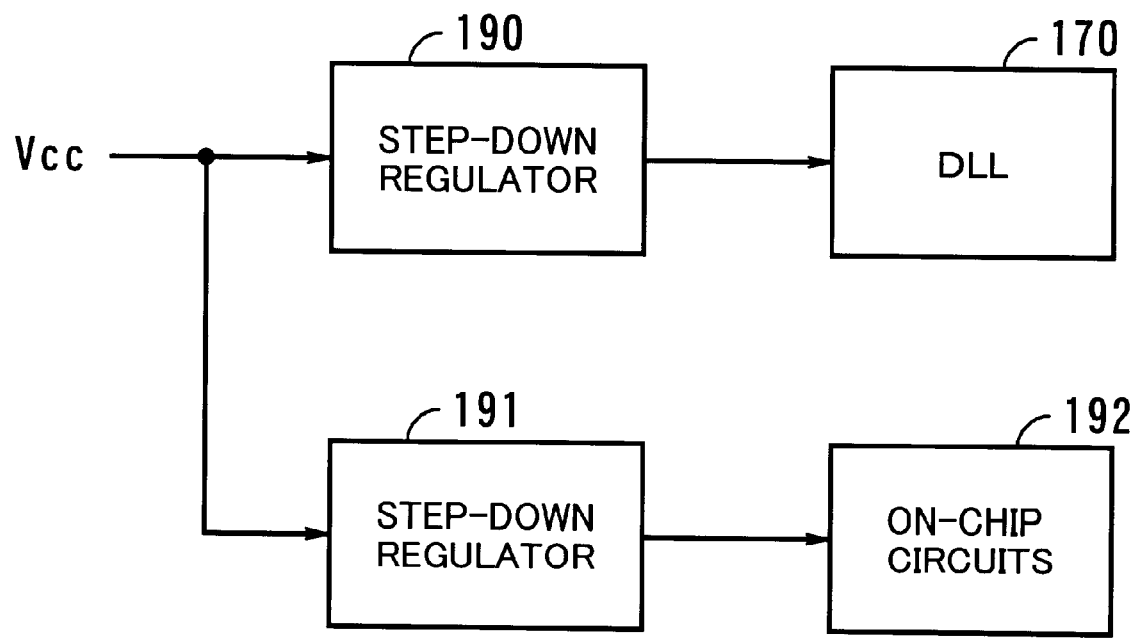
FIG. 22 shows a configuration of a power supply system which provides a supply voltage to the DLL in FIG. 20.

Referring next to FIGS. 20 to 22, still another embodiment of the present invention will be described. FIG. 20 is a block diagram of a semiconductor memory device according to a fourth embodiment of the present invention. The illustrated device shares some common functions and signals with the circuit discussed in FIG. 2. The following section will focus on its distinctive points, while affixing like reference numerals to like elements.

More specifically, the fourth embodiment differs from the first embodiment in that it has no frequency detector 20 or reference voltage selector 30. Instead, the fourth embodiment employs a delay-locked loop (DLL) 170 and a selector 171. The DLL 170 has a plurality of delay elements connected in series to give successively increasing delays to an incoming clock signal. The DLL 170 searches for a particular delay value with which the delayed clock signal is in phase with the original clock signal. This delay value will be used as a parameter to control supply voltages according to the clock frequency.

FIG. 21 shows the details of the DLL 170. The illustrated DLL 170 is composed of the following elements: a delay circuit 180, a shift register 181, a phase comparator 182, and a dummy circuit 183. The delay circuit 180 contains a plurality of cascaded delay elements, which produces successively increasing delays for an incoming clock signal. It also outputs the clock signal with a particular delay that is specified by selection signals f(1) to f(n) provided from the shift register 181.

The shift register 181 sets only one of its outputs to high. This "high" bit position is referred to as a shift count, which is controlled by the output of the phase comparator 182. More specifically, the shift register 181 increments the shift count when the phase comparator 182's output is high, and decrements it when that output is low. The outputs f(1) to f(n) of this shift register 181 are used by the selector 171 as its selection signals.

The output of the delay circuit 180 is supplied to the phase comparator 182 through the dummy circuit 183. The phase comparator 182 compares the phase of this delayed clock signal with that of the original clock signal to evaluate to what extent the two signals agree with each other. When the two signals show a greater agreement than the previous time, the phase comparator 182 sends a high level signal to the shift register 181, and otherwise, it outputs a low level signal. Obviously, the phase comparator will observe the best agreement between the two signals when the delay is zero or exactly one clock period. The former condition (i.e., zero delay), however, is undesired and should be avoided. The dummy circuit 183 is inserted in the loop to prevent the DLL 170 from being locked on such a false condition.

FIG. 22 shows a configuration of a power supply system which provides supply voltages to the DLL 170 and other circuits. It is known that delay elements constituting the delay circuit 180 are sensitive to supply voltage. Their delay time could vary with a fluctuation of the supply voltage, and even a small error in one delay element would amount up to a non-negligible level since the delay circuit 180 contains many such delay elements connected in series. This problem can be avoided by a power system as illustrated in FIG. 22. As seen from this block diagram, the DLL 170 has its dedicated power source (step-down regulator 190), while other on-chip circuits 192, including part of the DRAM 50, operate with another step-down regulator 191. These two step-down regulators 190 and 191 provide the DLL 170 and other on-chip circuits 192 with separate supply voltages that are produced by reducing a predetermined amount of voltage from the common supply voltage Vcc.

Referring back to FIG. 20, the selector 171 receives selection signals f(1) to f(n) from the DLL 170, besides being supplied with a plurality of reference voltages Vref(1) to Vref(n) from other source (not shown). The selector 171 extracts one reference voltage Vref according to the selection signals for use in the supply voltage generator 40.

The fourth embodiment operates as follows. A clock signal supplied to the DLL 170 is subjected to the delay circuit 180 containing a plurality of cascaded delay elements, which add successively increasing delays to the signal. The delay circuit 180 outputs one of the delayed clock signals that is associated with the active selection signal supplied from the shift register 181. This signal is entered to the dummy circuit 183.

The shift register 181 increments its shift count when the phase comparator 182's output is high, and decrements it when that output is low. Initially, just after the DLL 170 starts operation, the shift count is set to n, meaning that the n-th selection signal f(n) is set to "high" (activated). The delay circuit 180 selects the output of the topmost delay element. The dummy circuit 183 delays the selected signal for a predetermined amount of time. The phase comparator 182 compares the phase of this delayed clock signal with that of the original clock signal. Its output goes high when the two signals show a greater agreement than before, and otherwise, the output stays low. The delayed signal exactly matches with the original signal if its delay is one clock period. The phase comparator 182 regards this state as being the best match condition.

Suppose, for example, that the active selection signal changed from f(n) to f(n−1) and that change resulted in a better match between the two signals under phase comparison. The dummy circuit 183 would then assert its output to high. Think of another case where the active selection signal changed from f (n–2) to f (n–3) and that change ended up with a poorer match. The dummy circuit 183 would then negate its output to low.

After repeating the operation described above, the DLL 170 reaches an intended state where the output of the dummy circuit 183 is right in phase with the original clock signal, with a phase difference of one clock period. Since the currently active selection signal corresponds to the actual clock frequency, the selector 171 chooses a particular reference voltage associated with that selection signal. The supply voltage generator 40 then produces necessary supply voltages, as in the preceding embodiments, for use in the circuit blocks of the DRAM 50.

In the way described above, the fourth embodiment produces supply voltages appropriate to the actual clock frequency measured with a DLL. Besides being simpler than the circuit of FIG. 2, the fourth embodiment is particularly suitable for semiconductor devices that already have a DLL for their intended purposes. In this case, existing circuit resources can be utilized for power supply control.

Figure 23:
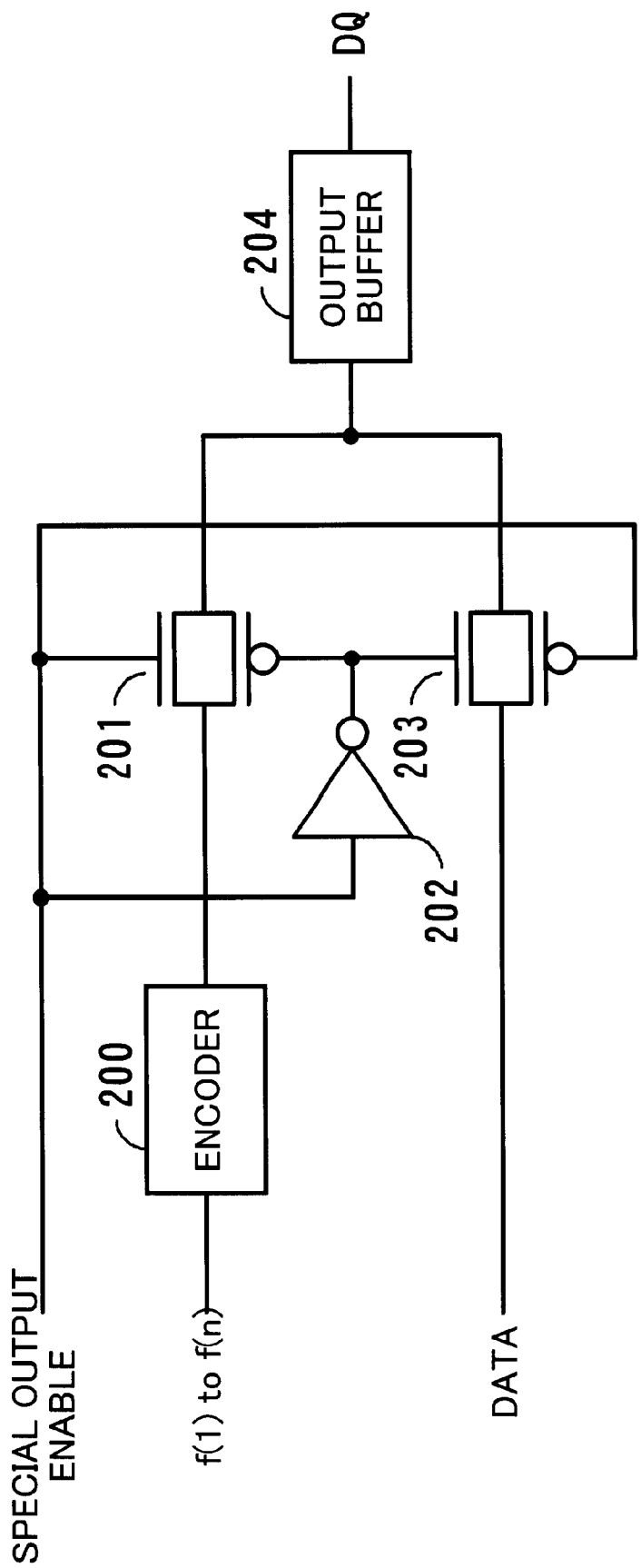
FIG. 23 is a block diagram of a fifth embodiment of the present invention.

Referring next to FIG. 23, a fifth embodiment of the present invention will be described. While its major part is similar to what have been explained in the first to fourth embodiments, the fifth embodiment is distinguishable from others in that it outputs selection signals f(1) to f(n) to outside of the device.

FIG. 23 shows a selection signal output circuit according to the fifth embodiment which sends out selection signals. As seen from this schematic diagram, the selection signal output circuit is composed of an encoder 200, CMOS switches 201 and 203, an inverter 202, and an output buffer 204.

The encoder 200 produces a bit sequence representing the currently active selection signal out of the selection signals f(1) to f(n). The CMOS switches 201 and 203 are controlled by a special output enable signal. When this signal is high, the first CMOS switch 201 turns on and permits the encoder 200 to send out the bit sequence. The second CMOS switch 203, on the other hand, turns on when the special output enable signal is low, allowing the semiconductor memory device to output its internal data.

The fifth embodiment operates as follows. The special output enable signal is asserted to high after the supply voltages are tuned in accordance with the clock frequency. The encoder 200 then produces a bit sequence representing the currently active selection signal. Since the second CMOS switch 203 is off, and the first CMOS switch 201 is on at this moment, the bit sequence produced by the encoder 200 appears at the output buffer 204, which normally outputs internal data. The bit sequence sent out in this way informs outer circuits of how the supply voltages are set up within the device, thus allowing them to configure their own supply voltages with the received bit sequence. This feature of the fifth embodiment enables further reduction of the entire system's power consumption.

When the first CMOS switch 201 becomes off and the second CMOS switch 203 turns on, the output buffer 204 begins outputting internal data of the device, instead of the bit sequence from the encoder 200.

As seen from the above explanation of the fifth embodiment, the proposed semiconductor device notifies outside circuits of its internal supply voltage setup. This feature permits the outer circuits to optimize their own supply voltages according to the received information, which enables further reduction of the entire system's power consumption.

While all the five embodiments have been described as part of DRAM devices, it is not intended to limit the present invention to that specific application or any other particular implementations.

Further, the present invention should not be limited to any particular circuit configurations that have been illustrated in this description of the invention. Regarding the reference voltage generator, for example, it would be possible to produce a plurality of reference voltages with a series of dividing capacitors, instead of a series of dividing resistors.

As for the linearity of reference voltages, the reference voltage generator may also be designed to produce a non-linear series of reference voltages, instead of equally spacing the voltage values to implement a linear relationship between the clock frequency and supply voltages to be generated.

Further, the proposed circuit may include a step-down regulator to provide a stabilized source voltage for the p-channel MOSFET 80 or 121. This configuration contributes to accurate operation of the circuit, because it helps the p-channel MOSFET 80 and 121 drive their loads more steadily, regardless of variations of Vcc.

Still another variation of the reference voltage generator is to replace the voltage dividing resistors 102(1) to 102(n+1) with a series of transistors having an appropriate on-resistance (a transistor's output impedance when it is turned on).

The above discussions are now summarized as follows. According to the present invention, a plurality of different reference voltages are produced by a reference voltage generator. A selector selects one of the produced reference voltages according to the cycle period of a given clock signal measured by a period measurement unit. A supply voltage generator produces necessary supply voltages based on the selected reference voltage. This structural arrangement permits the supply voltages to be fine-tuned in accordance with the actual clock period.

Further, the present invention provides a semiconductor memory device comprising a memory unit storing given data. To provide appropriate supply voltage for this memory unit, a plurality of different reference voltages are first produced by a reference voltage generator. Then a selector selects one of the produced reference voltages according to the cycle period of a given clock signal which is measured by a period measurement unit. A supply voltage generator produces necessary supply voltages for the memory unit based on the selected reference voltage. Besides those voltages, a regulator provides input/output interface circuits of the memory unit with a constant supply voltage that does not vary with the period of the clock signal. This structural arrangement enables each part of the semiconductor memory device to operate with an appropriate supply voltage, which can be fine-tuned in accordance with the actual clock signal frequency.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A supply voltage generating circuit, comprising:
   a reference voltage generator which generates a plurality of reference voltages having different voltage levels;
   a period measurement unit which measures the period of a given clock signal;

a selector which selects one of the generated reference voltages according to the measured clock period; and a supply voltage generator which produces a supply voltage having a voltage level that corresponds to the selected reference voltage.

2. The supply voltage generating circuit according to claim 1, wherein said supply voltage generator produces a lower supply voltage when the measured clock period is longer and a higher supply voltage when the measured clock period is shorter.

3. The supply voltage generating circuit according to claim 1, wherein said reference voltage generator produces the plurality of reference voltages by dividing a predetermined voltage with resistors.

4. The supply voltage generating circuit according to claim 1, wherein said period measurement unit comprises:

a capacitor which is charged during a period corresponding to the period of the given clock signal; and a plurality of comparators which compares a voltage developed across said capacitor with each of the reference voltages, whereby said period measurement unit identifies the period of the given clock signal from results of said comparison.

5. The supply voltage generating circuit according to claim 1, wherein said period measurement unit comprises:

a series of delay elements to delay the given clock signal; and a phase comparator which compares each of the delayed clock signal with the original clock signal to find a particular delay time value that corresponds to the period of the given clock signal, whereby said period measurement unit identifies the period of the given clock signal from said particular delay time.

6. The supply voltage generating circuit according to claim 5, further comprising a voltage regulator which regulates a supply voltage for said series of delay elements.

7. The supply voltage generating circuit according to claim 1, further comprising a supply voltage data sending unit which sends out a parameter that indicates what supply voltage is produced by said supply voltage generator.

8. A supply voltage generating circuit, comprising:

a reference voltage generator which generates a plurality of reference voltages having different voltage levels;

a selector which selects one of the generated reference voltages according to a given control parameter; and a supply voltage generator which produces a supply voltage having a voltage level that corresponds to the selected reference voltage.

9. A semiconductor memory device, comprising:

a memory unit which stores given data, comprising an input/output interface;

a reference voltage generator which generates a plurality of reference voltages having different voltage levels;

a period measurement unit which measures the period of a given clock signal;

a selector which selects one of the generated reference voltages according to the measured clock period;

a supply voltage generator which produces a supply voltage having a voltage level that corresponds to the selected reference voltage for use in said memory unit; and a constant supply voltage source which provides the input/output interface of said memory unit with a constant supply voltage that does not vary with the period of the clock signal.

10. The semiconductor memory device according to claim 9, further comprising a word line potential generator which produces another supply voltage for use as word line potential of said memory unit which is higher than the supply voltage produced by said supply voltage generator.

11. A semiconductor memory device, comprising:

a memory unit which stores given data;

a reference voltage generator which generates a plurality of reference voltages having different voltage levels;

a selector which selects one of the generated reference voltages according to a given control parameter; and a supply voltage generator which produces a supply voltage having a voltage level that corresponds to the selected reference voltage for use in said memory unit.

* * * * *